(12) United States Patent
Chiu et al.

(10) Patent No.: US 11,868,697 B2
(45) Date of Patent: Jan. 9, 2024

(54) BASE LAYOUT CELL

(71) Applicant: Taiwan Semiconductor Manufacturing Co., Ltd., Hsinchu (TW)

(72) Inventors: Shang-Hsuan Chiu, Hsinchu (TW); Chih-Liang Chen, Hsinchu (TW); Hui-Zhong Zhuang, Kaohsiung (TW); Chi-Yu Lu, New Taipei (TW); Kuang-Ching Chang, Hsinchu (TW)

(73) Assignee: Taiwan Semiconductor Manufacturing Co., Ltd, Hsinchu (TW)

( * ) Notice: Subject to any disclaimer, the term of this patent is extended or adjusted under 35 U.S.C. 154(b) by 168 days.

(21) Appl. No.: 17/459,485

(22) Filed: Aug. 27, 2021

(65) Prior Publication Data
US 2023/0068097 A1  Mar. 2, 2023

(51) Int. Cl.
*G06F 30/00* (2020.01)
*G06F 30/392* (2020.01)

(52) U.S. Cl.
CPC .................................. *G06F 30/392* (2020.01)

(58) Field of Classification Search
CPC .. G06F 30/392; G06F 30/394; G06F 2115/06; H01L 27/0207
See application file for complete search history.

(56) References Cited

U.S. PATENT DOCUMENTS

| 7,919,793 | B2* | 4/2011 | Iwata | H01L 27/0207 |
| | | | | 257/241 |
| 9,158,877 | B2* | 10/2015 | Hsieh | G06F 30/392 |
| 9,892,224 | B2* | 2/2018 | Lin | G06F 30/39 |
| 2016/0111421 | A1* | 4/2016 | Rodder | H01L 29/66545 |
| | | | | 438/283 |
| 2020/0411516 | A1* | 12/2020 | Sue | H01L 23/528 |

FOREIGN PATENT DOCUMENTS

CN  111199967 A  *  5/2020  ......... G06F 17/5072

* cited by examiner

*Primary Examiner* — Naum Levin
(74) *Attorney, Agent, or Firm* — Sterne, Kessler, Goldstein & Fox P.L.L.C.

(57) ABSTRACT

Systems, methods and devices are provided, which can include an engineering change order (ECO) base. A base layout cell includes metal layer regions, conductive gate patterns arranged above metal layer regions; oxide definition (OD) patterns, metal-zero layer over oxide-definition (metal-zero) patterns, at least one cut metal layer (CMD) pattern; and at least one via region. The base layout cell can be implemented in at least two non-identical functional cells. A first functional cell of the at least two non-identical functional cells includes first interconnection conductive patterns arranged connecting metal-zero structures corresponding to at least two metal-zero patterns in a first layout, and a second functional cell of the at least two non-identical functional cells includes second interconnection conductive patterns arranged connecting metal-zero structures corresponding to at least two metal-zero patterns in a second layout.

20 Claims, 16 Drawing Sheets

NOR 503

NAND 502

INV 501

BASE LAYOUT CELL

BACKGROUND

A semiconductor device may include a number of electronic devices in an integrated circuit (IC). The semiconductor device can be characterized by a layout representing the device in a plan view diagram, which can be decomposed into modules that carry out higher-level functions as required by the semiconductor device's design specification. Such modules can be characterized as functional cells. A library of functional cells can be defined (or predefined) and indexed for implementation in the semiconductor device design.

As technology improves, the density of a semiconductor device (in terms of the number of electronic devices per unit area or per unit volume) increases.

DESCRIPTION OF THE FIGURES

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1A:
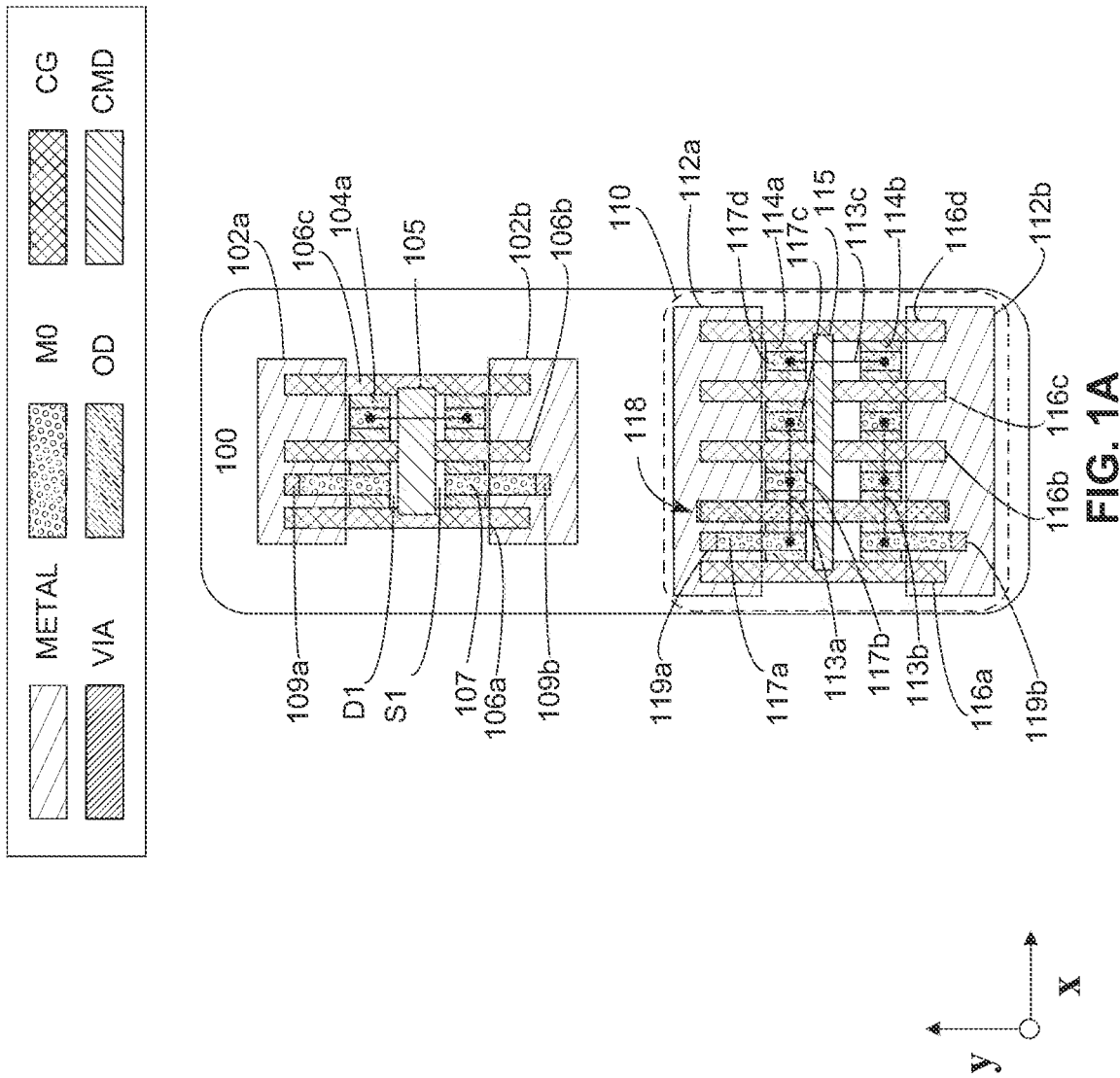
FIG. 1A is an illustration of a functional cell and associated base cell arrangement, according to some embodiments.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Embodiments described herein relate to an Engineering Change Order (ECO) base. According to some embodiments, a base layout cell (also referred to as an ECO base layout cell or ECO base) can be a base cell arrangement having one or more common layout patterns applicable to at least two non-identical functional cells. According to some embodiments, two or more base cell layouts can include metal layer regions, conductive gate (CG) patterns arranged above the metal layer regions; oxide definition (OD) patterns; metal-zero (e.g., also referred to as a "metal-zero layer over oxide-definition layer," "MOOD," or "MO") patterns; a cut metal layer (CMD) area pattern; and a via region. In some embodiments, the metal regions extend in a first direction and the conductive gate patterns extend in a second direction substantially perpendicular to the first direction. In some embodiments, the metal-zero patterns are arranged between the first metal region and the second metal region and extend in the second direction substantially perpendicular to the first direction.

According to some embodiments, a base layout cell can be arranged to be implemented in at least two different, non-identical functional cells. In one non-limiting example, the base layout cell can be implemented in a first functional cell that includes structures based on the base layout cell, and further includes interconnection conductive patterns arranged to connect metal-zero structures corresponding to metal-zero patterns in a first layout. In another non-limiting example, the base layout cell can be implemented in a second functional cell that includes structures based on the base layout cell and further includes other interconnection conductive patterns arranged to connect metal-zero structures corresponding to metal-zero patterns in a second layout.

Various base layout cells can be achieved by modifying one or more attributes, for example, by flipping or rotating one base layout cell, to permit an efficient selection of a base layout cell from multiple available base layout cells for application in a given functional cell. An efficient selection of a base layout cell can depend on factors including, for example, an intended functional cell, circuit, pitch requirement, etc.

According to some embodiments, functional cells can be implemented utilizing two or more base layout cells, which can be at least partially defined by base layout cell marks, in a combination cell to further enhance efficient space utilization. In some non-limiting examples, the first functional cell and the second functional cell of the at least two non-identical functional cells are selected from an inverter, an NAND, a NOR, or an AND-OR-INVERTER functional cell. In some embodiments, a functional cell implements a base layout cell that is selected based on a cell pitch value.

In some embodiments, the base layout cell is selected from two or more non-identical base layout cells to be implemented in the first functional cell and the second functional cell based on a determination of a cell pitch of the first functional cell and the second functional cell. In additional embodiments, a second circuit can include first circuits (e.g., functional cells that can be arranged in a sequence according to a base layout cell) further arranged in a sequence. According to some embodiments, the sequence may follow a regular abut pattern of two or more base layout cell implementations. In some embodiments, the sequence may follow a random abut pattern of two or more base layout cell implementations.

Figure 1B:
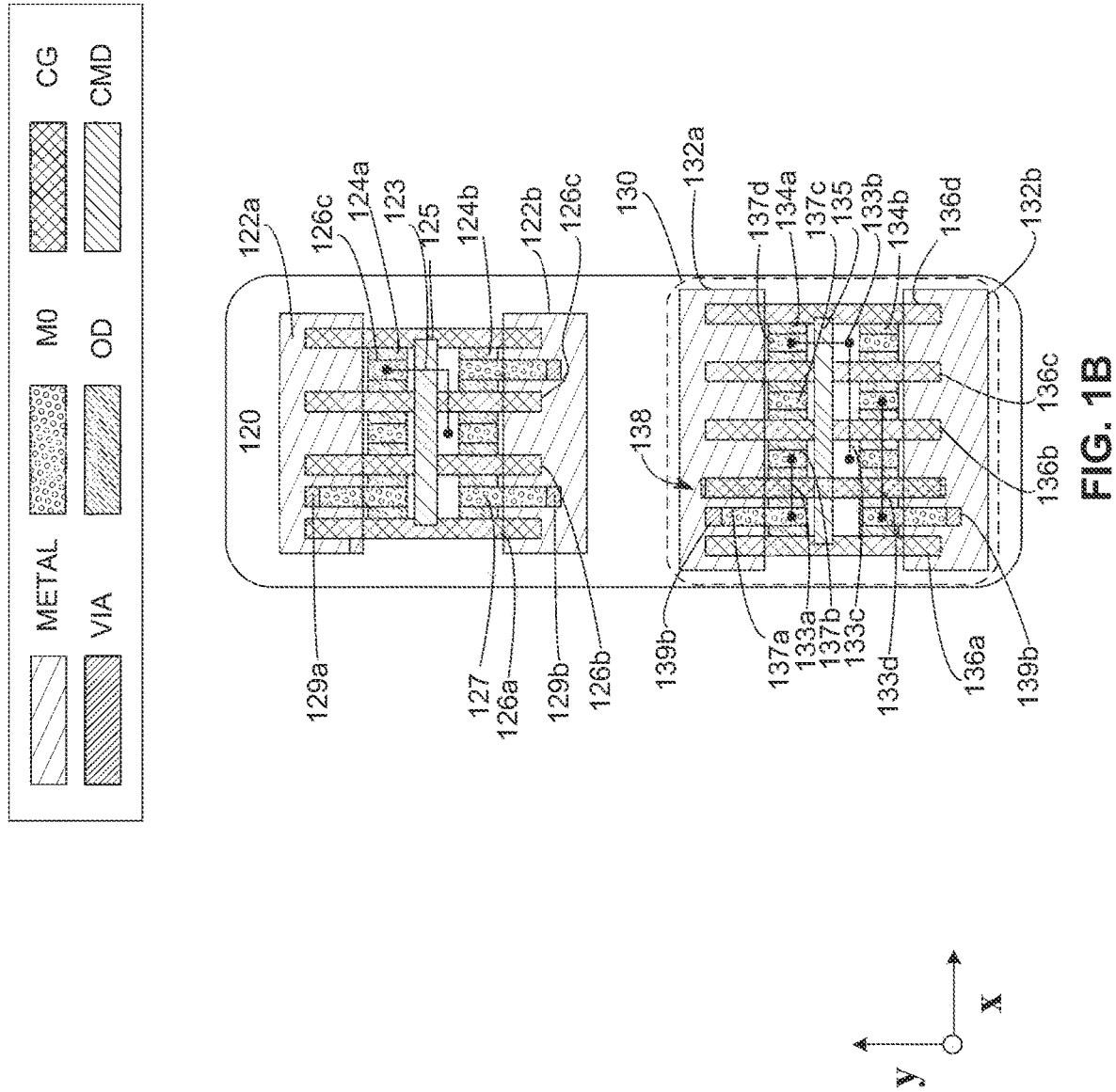
FIG. 1B is an illustration of a functional cell and associated base cell arrangement, according to some embodiments.
Figure 1C:
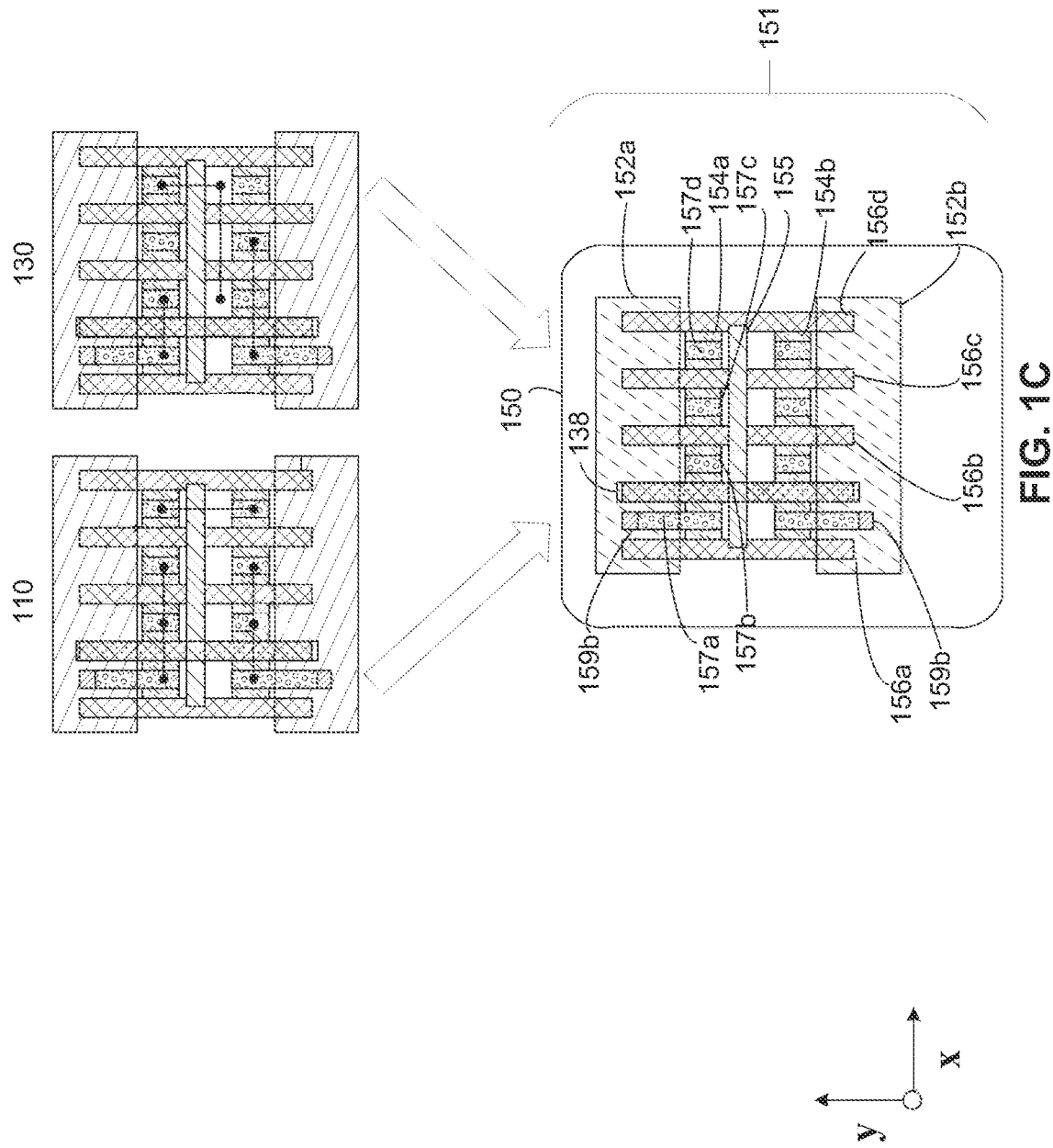
FIG. 1C is an illustration of a base layout cell, according to some embodiments.

FIGS. 1A and 1B are layout drawings of functional cells 100 and 120, respectively, associated with base cell arrangements 110 and 130. In accordance with some embodiments, base cell arrangements, not limited to base cell arrangements 110 and 130, can be characterized according to a base layout cell 150, as depicted in FIG. 1C, described in detail below. Not all layout patterns of functional cell 100 or 120, base cell arrangements 110 or 130, and base layout cell 150 are depicted in FIGS. 1A to 1C. Also, layout patterns described herein can be used to prepare a set of masks that are in turn used for manufacturing a standard cell in an integrated circuit.

Inverter Functional Cell

As illustrated in FIG. 1A, the layout of functional cell (also referred to as a "standard cell") 100 includes first metal area layout pattern 102a, second metal area layout pattern 102b, and conductive gate layout patterns 106. Active area layout patterns 104a and 104b are associated with forming active area structures (also referred to as oxide definition (OD) areas) of functional cell 100. In one non-limiting example, functional cell 100 can be implemented in an application of an inverter logic device, having vias 109a and 109b, and a cut metal (CMD) area 105.

According to some embodiments, first metal area layout pattern 102a and second metal area layout pattern 102b are associated with a conductive pattern arranged for interconnection to the functional cell. First and second metal layout patterns 102a/102b can be, for example, a voltage line, such as a power line, ground line, a reference voltage, a signal line or any other suitable voltage line. For example, first metal layout pattern 102a can correspond to a power line VDD and the second conductive pattern 112 corresponds to a ground line VSS for supplying power and ground voltages to the functional cell when the functional cell is programmed.

According to some embodiments, active area layout patterns 104a and 104b are associated with active regions of a transistor, e.g., an area where a source, a drain, and a channel under a gate of the transistor are formed. In some embodiments, active area layout pattern 104a defines a P-type transistor area, and active area layout pattern 104b defines an N-type transistor area.

Metal-zero patterns 107 (which can be metal-zero layer over oxide-definition (MOOD) layout patterns) are associated with forming corresponding metal structures that abut active area layout patterns 104a and 104b. In some applications, the resulting metal-zero structures (based on metal-zero patterns 107) can be used as source/drain electrodes of one or more transistors of functional cell 100. In some embodiments, the corresponding metal-semiconductor junction between metal structures associated with metal-zero patterns 107 and active area layout patterns 104a and/or 104b can further include one or more doped contact layers of a first type and/or second type. For example, a first type doped contact layer can refer to a contact layer doped with an n-type dopant, a second type doped contact layer can refer to a contact layer doped with a p-type dopant, or vice versa.

In some embodiments, the metal-zero patterns 107 can be electrically connected or integrated with conductive material layout patterns, such as source electrode S1 and drain electrode D1.

According to some applications, it may be desirable to remove some of the conductive material, such as portions of metal-zero patterns 107 as well as portions of conductive gate layout patterns 106a to 106c. Cut-metal (CMD) area pattern 105 can be defined outside at least active area layout patterns 104a and 104b. Removal of some of the conductive material decouples one conductive feature, such as metal-zero patterns 107, a source electrode S1, drain electrode D1, or the like, from other conductive features. According to some embodiments, some of the conductive material can remain to electrically couple certain features.

Conductive gate layout patterns 106a to 106c are associated with forming corresponding conductive gate structures of functional cell 100. In some non-limiting examples, conductive gate structures can include polysilicon, metal, other conductive material, or a combination thereof. As depicted in FIG. 1A, conductive gate layout patterns 106a to 106c overlap active area layout patterns 104a and 104b. In some embodiments, conductive gate layout pattern 106b is associated with forming gate electrodes of functional cell 100, and conductive gate layout patterns 106a and 106c are associated with forming conductive gate structures along edges of active area structures corresponding to active area layout patterns 104a and 104b.

Additionally, functional cell 100 can include a conductive material 103 to bridge an isolation area that is formed based on CMD area pattern 105. As depicted, conductive material 103 can connect a source or drain electrode of a transistor formed in active area layout pattern 104a with a source or drain electrode of a transistor formed in active area layout pattern 104b.

In view of the layout schematic drawing depicted in FIG. 1A, the resulting standard cell 100 manufactured based on layout pattern 110 have active area structures (based on active area layout patterns 104a and 104b), an isolation structure surrounding the active area structures, conductive gate structures (based on conductive gate layout patterns 106a to 106d) over the active area structures, a metal-zero structure (based on layout patterns 107) directly over a portion of the active area structure (based on layout pattern 102).

Inverter Base Cell Arrangement

In some embodiments, functional cell 100 can be characterized as a base cell arrangement 110. Base cell arrangement 110 can include patterns depicted for functional cell 100 arranged in a layout intended to be uniformly applied to multiple functional cells, as described in greater detail below and with reference to FIGS. 1B and 1C below.

Base cell arrangement 110 can include, in an arrangement similar to functional cell 100, conductive gate layout patterns 116a to 116d. Conductive gate layout patterns 116a to 116d are associated with forming corresponding conductive gate structures of the intended functional cell (e.g., functional cell 100). As depicted in FIG. 1A, conductive gate layout patterns 116a are configured to overlap active area layout patterns 114a and 114b. In some embodiments, conductive gate layout patterns 116a and 116d are associated with forming conductive gate structures along edges of active area structures corresponding to active area layout patterns 114a and 114b, and conductive gate layout patterns 116*b* and 116*c* are associated with forming gate electrodes of functional cell 100. Base cell arrangement 110 can further include via area patterns 119*a* and 119*b*.

In base cell arrangement 110, a continuous polysilicon (also referred to as a "continuous polysilicon at oxide-definition edge" or "CPODE") pattern 118 can be provided, which is based on conductive gate layout patterns 116*a* to 116*d*. Continuous polysilicon pattern 118, can be used to form a trench by removing at least portions of OD material, substrate material, and/or insulating material. In some embodiments, continuous polysilicon pattern 118 can be formed on an edge of an oxide definition (OD) region or an edge of a cell. The continuous polysilicon pattern 118 can be used to form one or more conductive gate structures along an edge region of active area structures corresponding to active area layout patterns 114*a* and 114*b*.

In view of the layout depicted in FIG. 1A, the resulting functional cell 100 manufactured based on layout patterns of FIG. 1A can have active area structures (based on active area layout patterns 114*a* and 114*b*), an isolation structure surrounding the active area structures, conductive gate structures (based on layout patterns 116*a* to 116*d*) over the active area structures, metal-zero structures (based on metal-zero patterns 117*a* to 117*d*) directly over a portion of the active area structure (based on active area layout pattern 114*a* and 114*b*), and via plugs (based on via pattern 119*a* and 119*b*) to electrically connect a terminal (e.g., an electrode, abutting circuit, or any other suitable external circuit) to a metal-zero structure (based on metal-zero layout pattern 117*a*).

In some embodiments, functional cell structures implemented with base cell arrangement 110 can include contact pattern 113*a* to 113*c* to electrically connect elements of the base layout cell to form a functional device or circuit, similar to functional cell 100. For example, electrodes of devices having active areas based on active area layout patterns 114*a* and 114*b* can be electrically connected by contact pattern 113*a* to 113*c*. For example, in an inverter application of functional cell 100, contact pattern 113*a* can be formed to connect structures associated with metal-zero layout pattern 117*a* to metal-zero patterns 117*b* and 117*c* over an active area structure based on active area layout pattern 114*a*. Additional contact pattern 113*b* can connect metal-zero layout pattern 117*a* to metal-zero patterns 117*b* and 117*c* over an active area structure based on active area layout pattern 114*b*. Further, contact pattern 113*c* can connect metal-zero layout pattern 117*d* over an active area structure based on active area layout pattern 114*a* to metal-zero layout pattern 117*d* over an active area structure based on layout pattern active area 114*b*.

NOR Functional Cell

Other embodiments of a functional cell can include functional cell 120, which can be implemented in another non-limiting example, in applications of a NOR functional cell (also referred to as an NR functional cell, NOR, or NR gate). Similar to functional cell 100, functional cell 120 can include first metal area layout pattern 122*a*, second metal area layout pattern 122*b*, and conductive gate layout patterns 126. Oxide definition (OD) layout patterns 124*a* and 124*b* are associated with forming active area structures of functional cell 120.

According to some embodiments, active area layout patterns 124*a* and 124*b* are associated with active regions of a transistor, e.g., an area where a source, a drain, and a channel under a gate of the transistor are formed. In some embodiments, active area layout pattern 124*a* defines a P-type transistor area, and active area layout pattern 124*b* defines an N-type transistor area.

As discussed above, metal-zero patterns 127 are associated with forming corresponding metal structures contacting active area layout patterns 124*a* and 124*b*. Metal-zero structures based on metal-zero patterns 127 can be used as source/drain electrodes of one or more transistors of functional cell 120. The metal structures corresponding to metal-zero patterns 127 can be formed to contact the drain/source of one of the transistors. For example, a first metal structure can refer to a source electrode or drain electrode, second metal structure can refer to the other of a source electrode or drain electrode. Further, one or more metal structures can have a composition selected from a metal diffusion layer or low barrier interface in contact with an active area.

CMD area pattern 125 is defined outside of active area layout patterns 124*a* and 124*b* to decouple conductive features from other conductive features. Conductive gate layout patterns 126 are associated with forming corresponding conductive gate structures of functional cell 120 and are configured to overlap with active area layout patterns 124*a* and 124*b*. As discussed above, conductive gate layout patterns 126*b* and 126*c* are associated with forming gate electrodes of functional cell 120, and conductive gate layout patterns 126*a* and 126*d* are associated with forming conductive gate structures along edges of active area structures corresponding to active area layout patterns 124*a* and 124*b*.

Functional cell 120 can include conductive material 123 to connect a source or drain electrode of a transistor formed in active area layout pattern 124*a* with a source or drain electrode of a transistor formed in active area layout pattern 124*b*, traversing an isolation area formed based on CMD area pattern 125.

A standard cell manufactured based on functional cell 120 can have active area structures (based on layout patterns 124*a* and 124*b*), an isolation structure surrounding the active area structures, conductive gate structures (based on layout patterns 126*a* to 126*d*) over the active area structures, a metal-zero structure (based on layout patterns 127) directly over a portion of the active area structure (based on layout pattern 122).

NOR Base Cell Arrangement

Similar to the embodiment of FIG. 1A, functional cell 120 can be characterized as a base cell arrangement 130. Base cell arrangement 130 can include patterns depicted for functional cell 120, as well as functional cell 100, arranged in a layout intended to be uniformly applied to multiple functional cells, as described in greater detail below and with reference to FIGS. 1B and 1C below.

Base cell arrangement 130 can include, in an arrangement similar to functional cell 100, conductive gate layout patterns 136*a* to 136*d*. Conductive gate layout patterns 136*a* to 136*d* are associated with forming corresponding conductive gate structures of the intended functional cell (e.g., functional cell 100). As depicted in FIG. 1A, conductive gate layout patterns 136*a* are configured to overlap active area layout patterns 134*a* and 134*b*. In some embodiments, conductive gate layout patterns 136*a* and 136*d* are associated with forming conductive gate structures along edges of active area structures corresponding to active area layout patterns 134*a* and 134*b*, and conductive gate layout patterns 136*b* and 136*c* are associated with forming gate electrodes of functional cell 120.

In base cell arrangement 130, a continuous polysilicon pattern 138 can be provided, which is based on polysilicon layout patterns 136*a* to 136*d*. Continuous polysilicon pattern 138 can be used to form a trench by removing at least portions of OD material, substrate material and/or insulating material. In some embodiments, continuous polysilicon pattern 138 can be formed on an edge of an oxide definition (OD) region or an edge of a cell. The continuous polysilicon pattern 138 can be used to form one or more conductive gate structures along an edge region of active area structures corresponding to active area layout patterns 134a and 134b.

In view of the layout depicted in FIG. 1A, the resulting functional cell 100 manufactured based on layout patterns of FIG. 1A can have active area structures (based on active area layout patterns 134a and 134b), an isolation structure surrounding the active area structures, conductive gate structures (based on layout patterns 136a to 136d) over the active area structures, metal-zero structures (based on layout patterns 137a to 137d) directly over a portion of the active area structure (based on active area layout pattern 134a and 134b), and via plugs (based on via pattern 139a and 139b) to electrically connect a terminal (e.g., an electrode, abutting circuit, or any other suitable external circuit) to a metal-zero structure (based on metal-zero layout pattern 137a).

Functional cell structures implemented with base cell arrangement 130 can include, in some embodiments, one or more contact patterns 133a to 133d that can be used to form conductive materials to electrically connect elements of the base layout cell to form a functional device or circuit similar to the embodiment of FIG. 1A. For example, electrodes of devices having active areas/ODs 134a and 134b can be electrically connected by contact patterns 133a to 133d. For example, in a NOR application of functional cell 120, contact pattern 133a can be formed to connect metal-zero layout pattern 137a to metal-zero layout pattern 137b over an active area structure based on active area layout pattern 134a. Conductive material 133b can be formed to connect metal-zero layout pattern 137d corresponding to active area layout pattern 134a and metal-zero layout pattern 137d corresponding to active area layout pattern 134b, respectively. Conductive materials 133c and 133d can connect, respectively, metal-zero layout pattern 137d to metal-zero layout pattern 137b and metal-zero layout pattern 137c to metal-zero layout pattern 137a over an active area structure based on active area layout pattern 134b.

Devices, such as transistors of a first type (e.g., an n-type or p-type) active area, are based on active area layout patterns 134a. Devices, such as transistors of a second type (e.g., the other of the n-type or p-type) active area are based on active area layout patterns 134b. By providing electrical connections between such devices, a functional cell can be manufactured based on base cell arrangement 130 for a variety of applications, such as an NOR gate corresponding to functional cell 120.

ECO Base

A base layout cell methodology is provided, recognizing layout patterns and attributes that are common to various base cell arrangements (e.g., one or more of base cell arrangements 110, 130, or additional base cell arrangements not shown). According to some embodiments, one or more functional cells can be defined by a base layout cell. That is, a base layout cell can be placed in a layout as described below.

As illustrated in FIG. 1C, a base layout cell 150 can incorporate layout patterns common to the one or more functional cells ("common layout patterns"). Common layout patterns 151 can include patterns, elements, and other attributes that are shared by two or more functional cells. Also, base layout cell 150 can be defined to omit features, such as interconnections, that are not commonly shared between at least two functional cell layout patterns (e.g., base cell arrangements 110 and 130). Moreover, one or more base layout cells, such as base layout cell 150, can be defined to include one or more common layout patterns 151 having a minimum pitch attribute.

As illustrated in FIG. 1C, the physical structure of an intended functional cell, e.g., whether functional cell 100 or functional cell 120, can be characterized as a base layout cell 150. In non-limited examples, base layout cell 150 is defined based on at least base cell arrangements 110 and 130 and has a cell pitch of 4 contacted poly pitch (CPP). Metal-zero patterns 156a to 156d correspond to metal-zero patterns 116a to 116d and 136a to 136d. Features that are not shared by intended functional cells are omitted. In some embodiments, conductive patterns (such as contact area patterns 113 and 133 corresponding respectively to conductive material 103 and 123) that are not shared in common by the underlying base cell arrangements are omitted from base layout cell 150.

In some embodiments, metal-zero structures based on metal-zero patterns 156a to 156d can be manufactured in one or more steps. One or more additional metal structures, such as via plugs associated with 159a and 159b are formed over metal-zero structures based on metal-zero patterns 156a to 156d. In some embodiments, metal-zero structures based on 156a to 156d can be formed of a material including tungsten, copper, composite copper, or composite tungsten.

Examples of materials of associated with active area (OD) patterns include, but are not limited to, semiconductor materials doped with various types of p-dopants and/or n-dopants. In some embodiments, active area layers 154a and 154b include an elementary semiconductor, a compound semiconductor, an alloy semiconductor, or combinations thereof. According to some embodiments, exemplary semiconductors can include, but are not limited to, silicon and germanium, silicon carbide, gallium arsenic, gallium phosphide, indium phosphide, indium arsenide, and indium antimonide, SiGe, GaAsP, AlInAs, AlGaAs, GaInAs, GaInP, GaInAsP, or any other suitable semiconductor materials including group III, group IV, and group V elements. In some embodiments, active area layers 154a and 154b include a semiconductor on insulator (SOI), a doped epitaxial layer, a gradient semiconductor layer, and/or a stacked semiconductor structure with one semiconductor layer (e.g., Si) overlying another semiconductor layer (e.g., Ge) of a different type. In some embodiments, active area layers 154a and 154b can be materials having different type dopants.

Diversification of ECO Base

Figure 2:
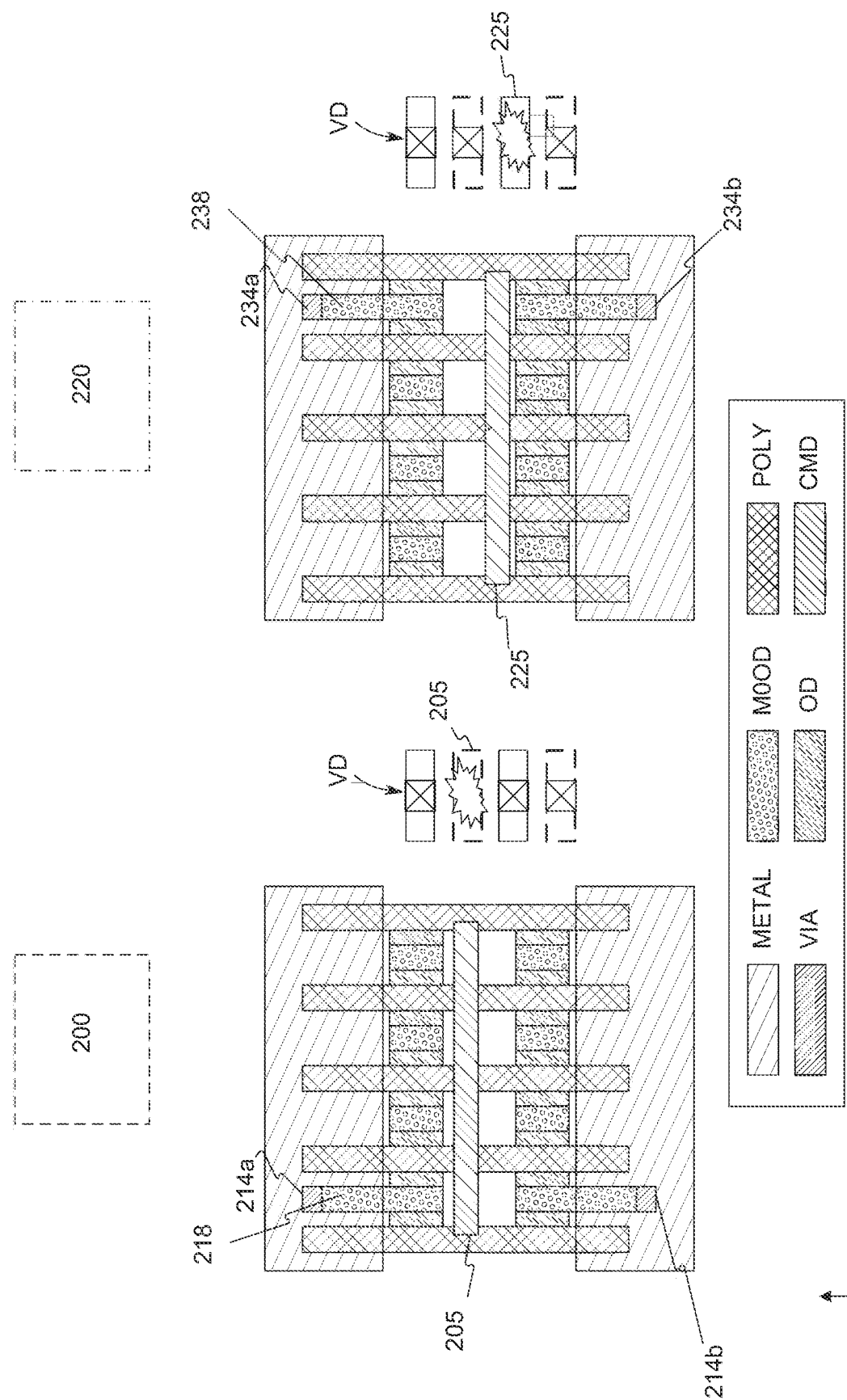
FIG. 2 is an illustration of various base layout cells, according to some embodiments.

Alternative base layout cells can be obtained by varying attributes of the base layout cell. FIG. 2 depicts rotating attributes (e.g., along an x-axis or a y-axis) to obtain alternative base layout cells, diversifying functional cells that can be implemented in accordance with some embodiments. Base layout cell 200 can be an embodiment of base layout cell 150, having common layout patterns 151. For example, base layout cell 200 includes active areas 214a and 214b, CMD area pattern 205 along a lower edge of active area 214a, and continuous polysilicon 218 disposed on a first region of a central axis extending along the y-axis.

By flipping or rotating base layout cell 200, base layout cell 220 can effectively, be provided as a layout pattern for one or more unique functional cells. Base layout cell 220 includes active areas 234a and 234b, CMD area pattern and continuous polysilicon 238.

According to some embodiments, two or more different base layout cells 200 and 220 can be provided by varying attributes of the common layout patterns (e.g., common layout patterns 151).

As depicted in FIG. 2, rotating or otherwise alternating a layout is performed to modify attributes associated with one or more of the common layout patterns. In one non-limiting example, base layout cell 200 is rotated, flipped, or mirrored along an axis, such as the x-axis to attain base layout cell 220. By the alternating, CMD area pattern 205 on a lower edge of active area 214a is shifted, becoming CMD area pattern 225 along an upper edge of active area 234b. Continuous polysilicon 218 is shifted to continuous polysilicon 238 disposed on a second region of the central axis. As a result, diversified base layout cells 200 and 220 are achieved. An integrated circuit implementing base layout cell 220 includes a CMD area pattern 225 along a top edge of active area 234b.

Selection of ECO Base

As described above, base layout cells (e.g., base layout cell 200 and 220) can be achieved by modifying one or more attributes, for example, by flipping or rotating a base layout cell. Providing a base layout cell that can yield additional varieties enables the efficient selection of a base layout cell for a functional cell. The selection of a base layout cell can depend on factors including, for example, an intended functional cell, circuit, pitch requirement, etc.

Figure 3A:
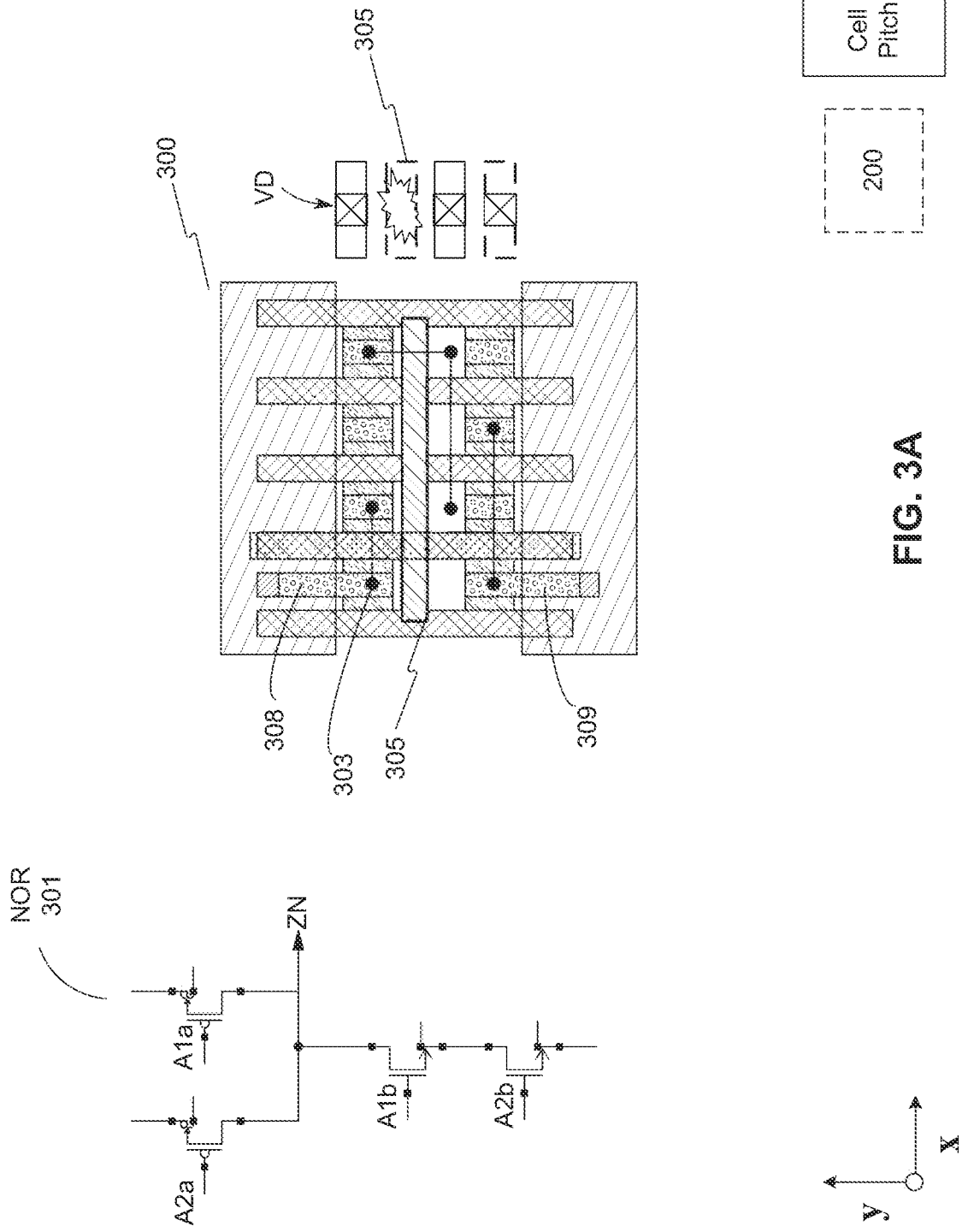
FIG. 3A is an illustration of an implementation of a first base layout cell, according to some embodiments.
Figure 3B:
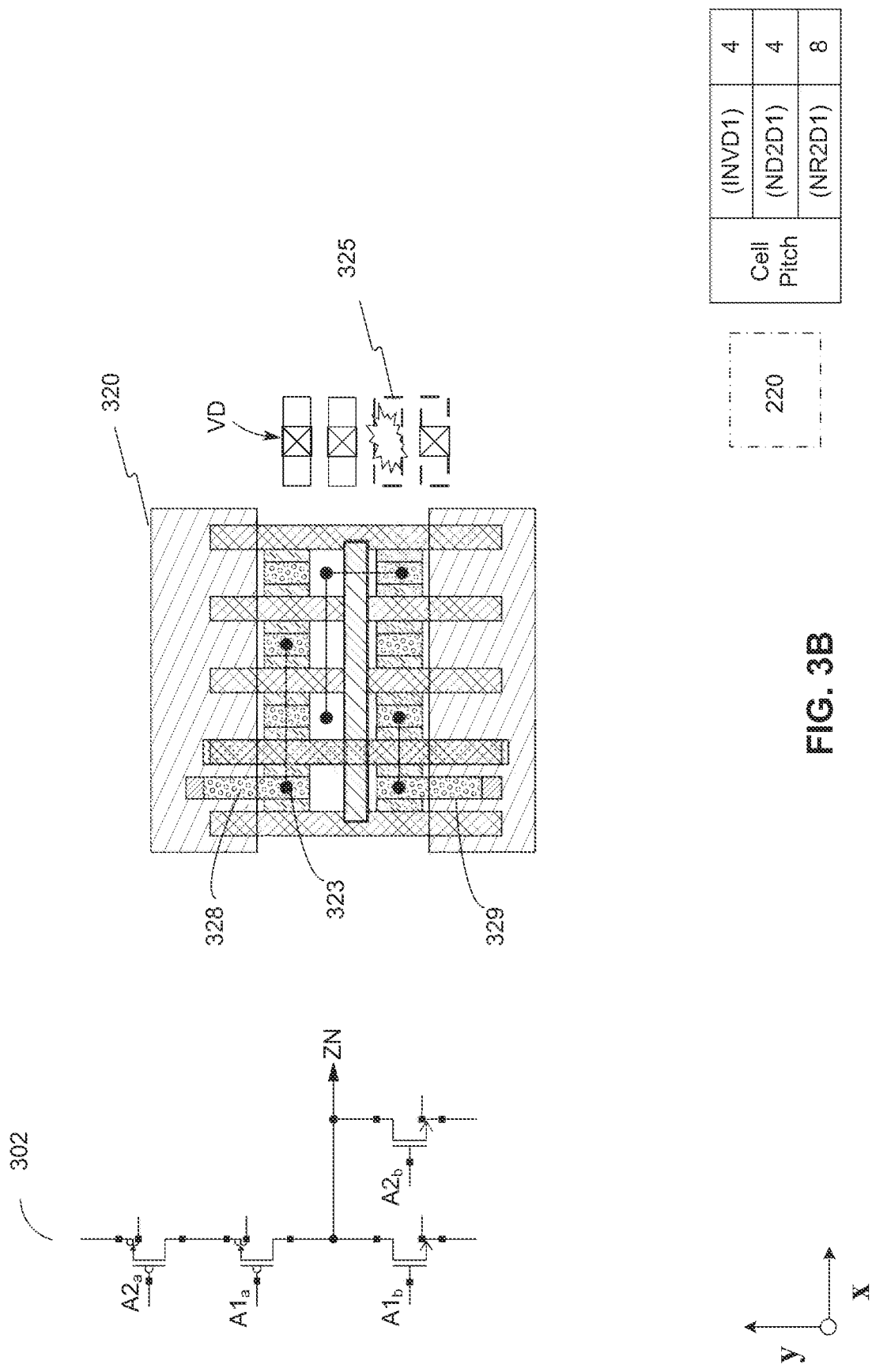
FIG. 3B is an illustration of an implementation of a second base layout cell, according to some embodiments.

FIGS. 3A and 3B depict selection of an appropriate base layout cell (e.g., 200 or 220), placing the selected base layout cell in a layout, and connecting active areas of the base layout cell to implement a variety of applications. The selection can be based on, for example, determination of a cell pitch resulting at least from varying positions of CMD 305 or CMD 325.

As shown in FIG. 3A, an application of a functional cell, such as an NOR functional cell 301, can be formed using a first circuit 300, utilizing base layout cell 200, according to some embodiments. In this example, conductors 303 can be formed to bridge connections between transistors A1a, A2a, A1b, and A2b of an intended functional cell 301. Accordingly, implementing NOR functional cell 301 can be achieved using a base layout cell having an efficient layout.

First circuit 300, such as a functional cell or device, can be implemented utilizing transistors A2a and A1a (e.g., p-type transistors) having a channel in active area 304a, which can be a p-type semiconductor material. Additionally, first circuit 300 can be implemented utilizing transistors A2b and A1b (e.g., n-type transistors) having a channel in active area 304b, which can be an n-type semiconductor material.

One or more contact area patterns 303 can be formed to electrically connect one or more metal-zero structures 308, serving as a drain and source of transistors A2a and A1a, respectively. At least one contact area pattern 303 can be formed to bridge an electrical connection between metal-zero structures 308 and 309, which can function as drain electrodes of transistors A1a and A1b, respectively. One or more contact area patterns 303 can be formed to electrically connect one or more metal-zero structures 309 that function as drain electrodes of transistors A1b and A2b. Source electrodes of n-type transistors A1b and A2b can be formed in one or more metal-zero structures 309. One or more contact area patterns 303 can be formed to electrically connect one or more metal-zero structures 308 and 309, serving as drain electrodes of n-type transistors A1b and A2b, respectively.

In some embodiments, as depicted in FIG. 3B, a first circuit 320 can be another application of a functional cell and can be an NAND functional cell (also referred to as an ND functional cell, an NAND, or ND gate). NAND functional cell 302 can be formed using a different base layout cell, e.g., base layout cell 220. In this example, conductors 326a to 326d can be formed to bridge connections between transistors A1a, A2a, A1b, and A2b of the intended functional cell 302. Accordingly, implementing NOR functional cell 302 can be achieved using a base layout cell having an efficient layout.

For example, first circuit 320 can be implemented utilizing transistors A2a and A1a (e.g., p-type transistors) having a channel in active area 324a, which can be a p-type semiconductor material and transistors A2b and A1b (e.g., n-type transistors) having a channel in active area 324b, which can be an n-type semiconductor material.

One or more contact area patterns 323 can be formed to electrically connect metal-zero structures 328, serving as a drain and source of transistors A2a and A1a, respectively. At least one contact area pattern 323 can be formed to traverse CMD 325 and form an electrical connection between metal-zero structures 328 and 329, which can function as drain electrodes of transistors A1a and A1b, respectively. At least one contact area pattern 323 can be formed to electrically connect one or more metal-zero structures 329 that function as drain electrodes of transistors A1b and A2b. Source electrodes of n-type transistors A1b and A2b can be formed in one or more metal-zero structures 329. Contact area pattern can be formed to electrically connect one or more metal-zero structures 328 and 329, serving as drain electrodes of n-type transistors A1b and A2b, respectively.

In the above examples, NAND, NOR, or INVERTER functional cells can be implemented in a first circuit utilizing either base layout cell 200 or 220. However, the selection of base layout cell can affect attributes, for example, a cell pitch of the functional cell.

For example, a NOR functional cell can be provided as a first circuit 300 and having a cell pitch value based on a layout of base layout cell 200, e.g., a cell pitch of 4 CPP. On the other hand, due to the placement of CMD 325 along a bottom edge of active area 304a, an NAND functional cell would require two devices based on base layout cell 200. Thus, an NAND functional cell implemented based on base layout cell 200 can attain a cell pitch of 8 CPP.

On the other hand, as shown in FIG. 3B, an NAND functional cell, e.g., first circuit 320, can be formed having a cell pitch value based on a layout of base layout cell 220, e.g., a cell pitch of 4 CPP, which is less than, and preferable, to the cell pitch in an implementation of base layout cell 200.

Similarly, due to the position of CMD associated with CMD area pattern 225 in base layout cell 220, a NOR functional cell can be implemented utilizing base layout cell 220 but requiring two devices, whereas an implementation of first circuit 300 utilizing base layout cell 200 requires one device. Therefore, it is preferable to implement an NOR functional cell utilizing base layout cell 200, requiring a single device and a cell pitch of 4 CPP.

In other examples, an INVERTER functional cell having a cell pitch of 4 CPP can also be provided using base layout cell 200 (e.g., as shown in FIG. 1A) or 220 (not shown), achieving a cell pitch of 4 CPP.

Combination Cells Based on One or More Base Layout Cells

As described above, by providing more than one base layout cell (e.g., base layout cell 200 and 220) and based on determination of an efficient base layout cell, functional cells can be provided in a first circuit (for example, first circuit 300 or 320), where the base layout cell is selected to minimize cell pitch. Additionally, by merging two or more circuits, such as functional cells, into a first circuit arranged efficiently within a second circuit, a cell pitch of an integrated circuit device can be further minimized.

Figure 4A:
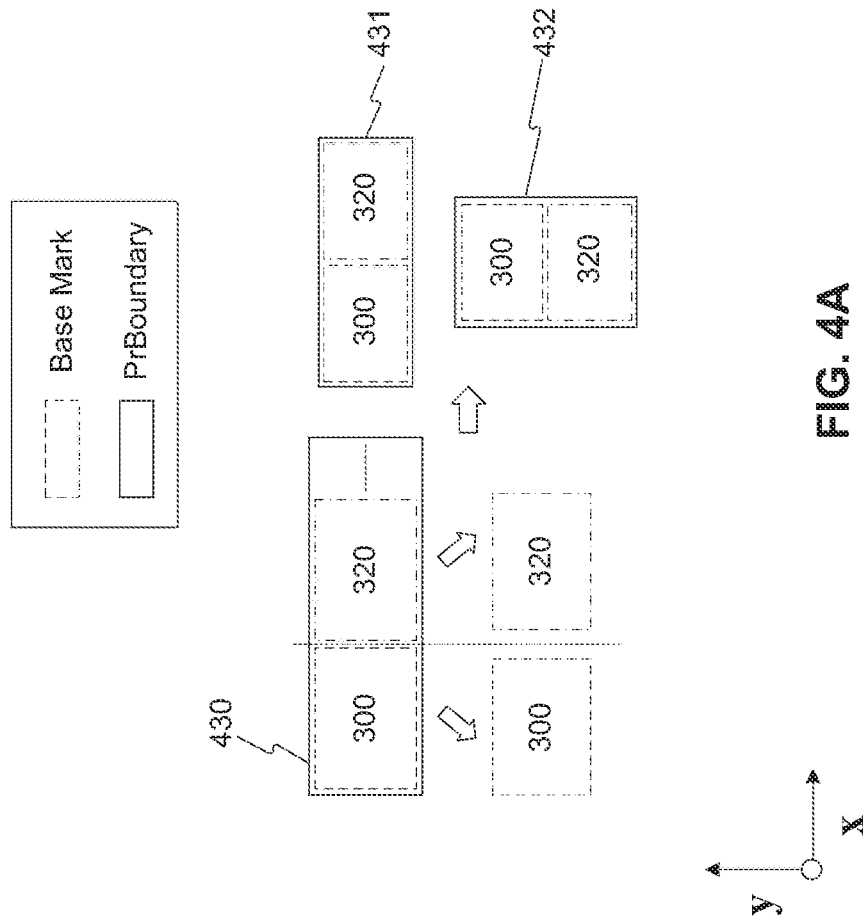
FIG. 4A is an illustration of combination cells implementing a first base layout cell in combination with a second base layout cell, according to some embodiments.

For example, as illustrated in FIG. 4A, it is preferable that a circuit designer (utilizing, for example, an automatic place and route (APR) methodology) implement functional cells implemented on two or more base layout cells, having base layout cell marks, rather than a place and route boundary (also referred to as a "PRboundary" or "boundary"). For example, as shown in FIG. 4A, two or more base layout cells (e.g., base layout cell 200 and 220) can be provided in a first circuit interconnected with or within a second circuit (also referred to as a combination cell) and defined by boundary 430. In implementing two or more base layout cells in a second circuit, such as a combination cell integrated circuit (IC) device, efficiencies can be achieved by designing cells having reduced pitch.

According to some embodiments, circuits utilizing base layout cells (e.g., first circuits 300 and 320 utilizing, respectively, base layout cells 200 and 220) can be implemented horizontally (e.g., along an x-axis) within a second circuit 431 defined by boundary 430. According to other embodiments, first circuits 300 and 320 can be stacked vertically (e.g., along a y-axis) within a second circuit 432 defined by boundary 430.

Figure 4B:
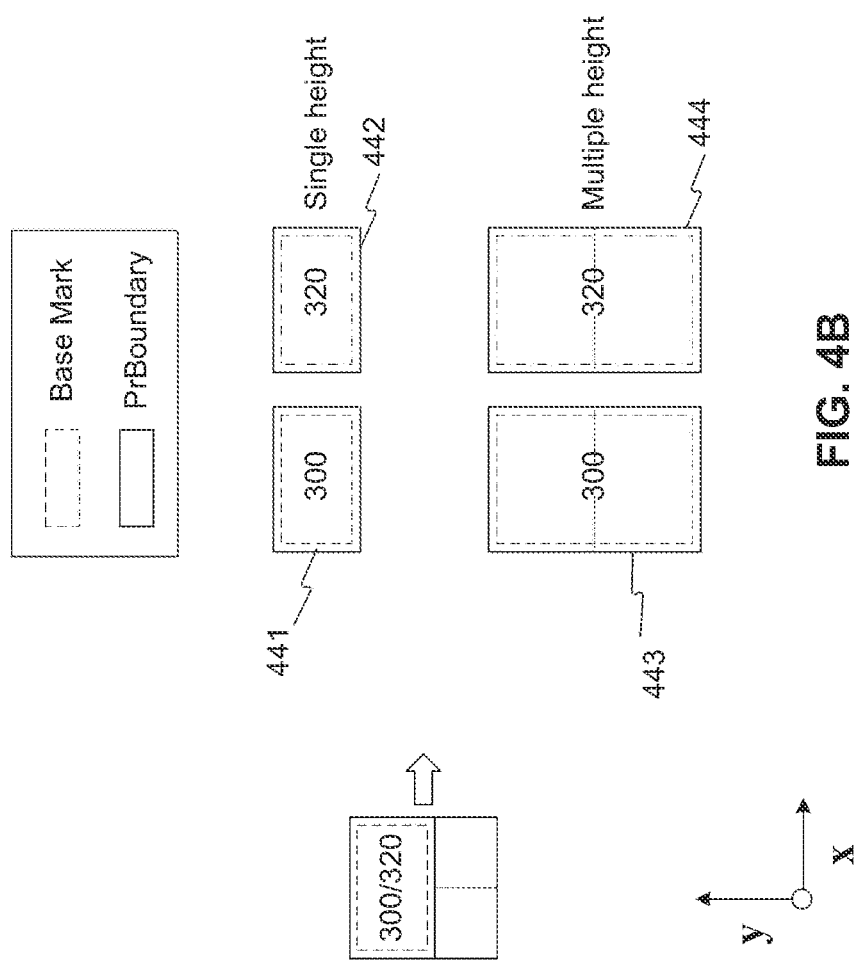
FIG. 4B is an illustration of arrangements of a base layout cell in a combination cell, according to some embodiments.

The base layout cell marks of first circuits 300 and 320 define a functional cell, and the individual devices are formed by relying on the given base layout cell mark (also referred to as an ECO base mark) rather than the overarching boundary. Although two base layout cells are illustrated in these examples, horizontally or vertically aligned, embodiments are not limited to these examples, and a variety of circuits can be schemed and implemented using one or more base layout cells. As shown in FIG. 4B, additional second circuits 441 and 442 can be implemented using a first circuit of a single base layout cell (e.g., entirely implemented utilizing first circuit 300/base layout cell 200 or first circuit 320/base layout cell 220) arranged horizontally. Other functional cells, such as second circuit 443 and 444 can be implemented using a single base layout cell (e.g., first circuit 300 or first circuit 320) stacked vertically.

Implementation Method of a Base Layout Cell

Figure 8A:
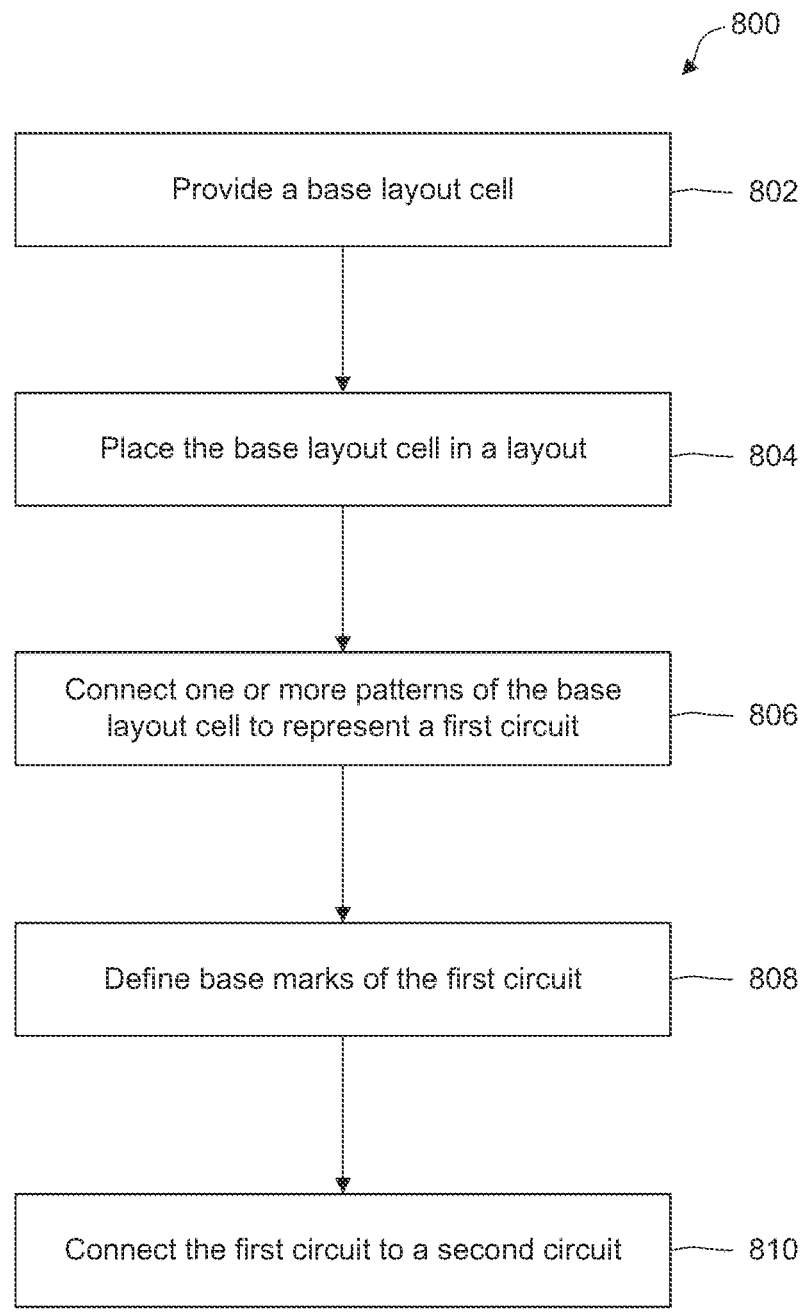
FIG. 8A is an illustration of a flow diagram of a method for implementing base layout cells, according to some embodiments.

FIG. 8A is a flow diagram of exemplary method 800 for implementation of a base layout cell (e.g., 200 or 220) in a functional cell circuit. Referring to FIG. 8A, at operation 802, a base layout cell is provided. The base layout cell can be selected to provide an efficient layout for an intended functional cell or combination cell. According to some embodiments, the base layout cell can include one or more of: first and second metal layer patterns extending in a first direction; active area layer patterns, extending in the first direction, between the first metal layer pattern and the second metal layer pattern; conductive gate layer patterns extending in a second direction perpendicular to the first direction and traversing over the first and second metal layer patterns and over the plurality of active area layer patterns; contact layer patterns extending in the second direction between two conductive gate layer patterns, at least one traversing over at least one active area layer pattern; and a cut metal layer extending in the first direction, between two active area layer patterns, and between at least two conductive gate layer patterns. In some embodiments, the base layout cell can include one or more layout patterns, including one or more of the above-mentioned patterns, common to non-identical functional cell layouts.

At operation 804, the selected base layout cell is placed in a layout. For example, the base layout cell can be placed by a computing device in a layout. In some embodiments, the layout can include one or more additional elements other than the base layout cell. In some embodiments, the layout can include additional identical or different base layout cells. In some embodiments, the layout represents a functional cell that is characterized at least by the base layout cell. In some embodiments, the base layout cell is placed in the layout by an automated place and route (APR) function of the computing device.

At operation 806, one or more patterns of the base layout cell are connected. The active areas of the base layout can be connected cell to form a first circuit, for example, for use in a variety of applications, including but not limited to functional cells, logic circuits, memory arrays, processors, etc. In some embodiments, interconnection conductive patterns are arranged to connect metal-zero structures corresponding to metal-zero patterns in a first layout. In some embodiments, interconnection conductive patterns are arranged to connect one or more active area layers corresponding to active area layer patterns in a first layout. In some embodiments, interconnection conductive patterns are arranged to connect one or more of the first and second metal layer corresponding to first and second metal layer structures. In some embodiments, interconnection conductive patterns are arranged to connect one or more of the conductive gate layer patterns corresponding to conductive gate structures.

At operation 808, one or more boundaries of the first circuit are defined, where the base mark indicates a boundary of at least one layout pattern with an arrangement common to a plurality of functional cell layouts. In some embodiments, base layout cell base marks of the base layout cell indicate one or more boundaries of the functional cell. Thereby, a functional cell is associated to the base layout cell, utilizing a base layout cell mark instead of an higher-level boundary, such as a place-and-route (PR) boundary.

At operation 810, the first circuit can be connected to a second circuit. The second circuit can be another implementation of a functional cell from a base layout cell. In some embodiments, the second circuit can be a circuit arranged identically the first circuit. In other embodiments, the circuit can have a different arrangement or be an implementation of a base layout cell that is different from one selected for the first circuit at operation 802. The selection of the base layout cell for implementation in the first circuit, the second circuit, or both, can be based on, for example, determination of a cell pitch resulting from the combined circuit. In another non-limiting example, the base layout cell can be implemented in a second functional cell that includes structures based on the base layout cell and further includes other interconnection conductive patterns arranged to connect metal-zero structures corresponding to metal-zero patterns in a second layout. In one example, a first circuit (e.g., 300 or 320) can be an application of a functional cell, such as a NAND functional cell, while a second circuit (e.g., 300 or 320) can be a NOR functional cell formed using a different base layout cell. In another example, the first circuit and the second circuit can both be a NAND functional cell with the same layout.

Circuit Fabrication

Figure 8B:
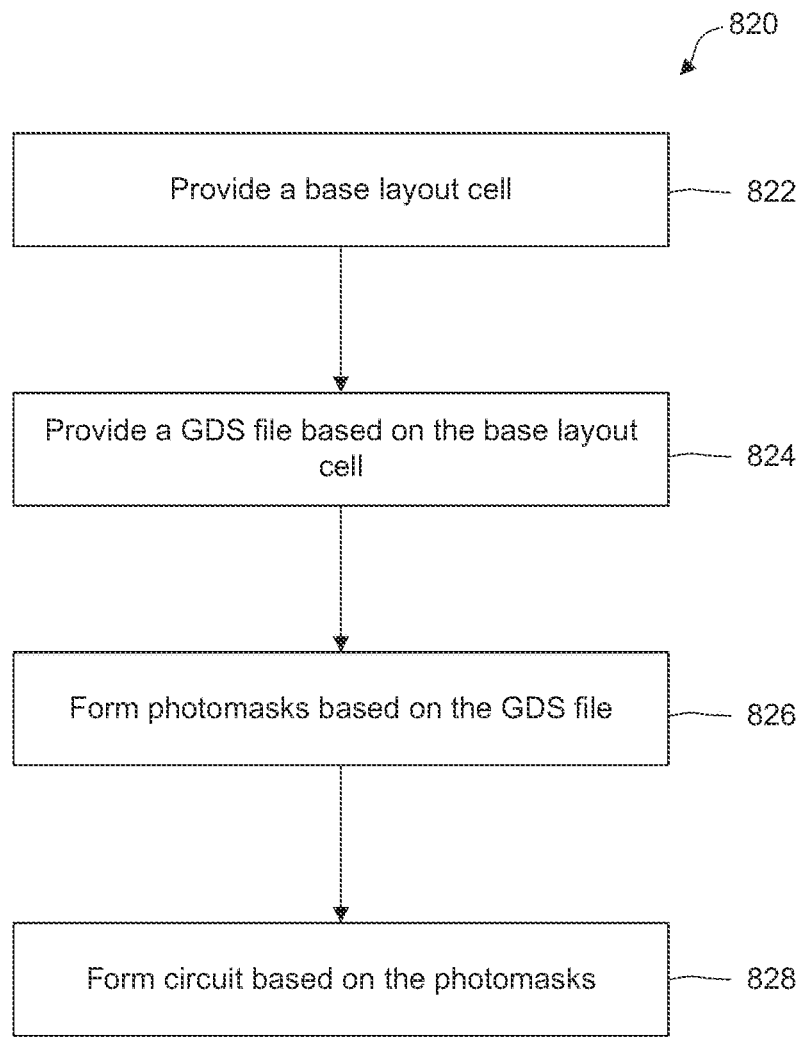
FIG. 8B is an illustration of a flow diagram of a method for fabricating a circuit, according to some embodiments.

FIG. 8B is a flow diagram of exemplary method 820 for circuit fabrication of a semiconductor device that includes functional cells defined in part according to a base layout cell, or a mix of base layout cells. In some embodiments, method 820 performs an operation of generating a base layout cell by determining common layout patterns applicable to two or more non-identical functional cells. Operations of method 820 can also be performed in a different order and/or vary. Variations of method 820 are within the scope of the present disclosure.

Referring to FIG. 8B, at operation 822, a base layout cell is provided. For example, a computing device can generate or retrieve a base layout cell, which can be an embodiment of base layout cell 200 or 220, and which includes first and second metal layer regions, first conductive gate patterns arranged above the first and second metal layer regions, first active area layout patterns, first metal-zero patterns, one or more CMD patterns, and at least a first pair of via regions.

For example, a computing device can generate or retrieve a base layout cell, which can be an embodiment of base layout cell 200 or 220. As described throughout the disclosure, the base layout cell can include one or more of: first and second metal layer patterns extending in a first direction; active area layer patterns, extending in the first direction, between the first metal layer pattern and the second metal layer pattern; conductive gate layer patterns extending in a second direction perpendicular to the first direction and traversing over the first and second metal layer patterns and over the plurality of active area layer patterns; contact layer patterns extending in the second direction between two conductive gate layer patterns, at least one traversing over at least one active area layer pattern; and a cut metal layer extending in the first direction, between two active area layer patterns, and between at least two conductive gate layer patterns. The base layout cell is arranged to include common layout patterns to be implemented in a functional cell of the at least two non-identical functional cells. At 822, the base layout cell is placed by the computing device in a layout. In some embodiments, the computing device connects one or more of the first and second metal layer patterns, the active area layer patterns, the conductive gate layer patterns, the contact layer patterns to represent a first circuit. In some embodiments, the computing device connects the first circuit to a second circuit.

The base layout cell can be selected by the computing device from base layout cells applicable to an inverter functional cell, an NAND functional cell, a NOR functional cell, or an AND-OR-INVERTER functional cell, according to some embodiments. In some embodiments, the base layout cell is based on a layout cell pitch value. In some embodiments, the first circuit to the second circuit are connected by arranging the first circuit and the second circuit based on a combined cell pitch of the first circuit and the second circuit. Arranging the first circuit and the second circuit can be performed with an electronic design automation tool. In some embodiments, one or more of the first and second metal layer patterns are connected by routing one or more of the first and second metal layer patterns to a power supply, ground, or a combination thereof.

In operation 824, an integrated circuit design is provided, for example, in a data file such as a Graphic Data System (GDS) file. The file can be generated by an EDA tool and contain at least one functional cell structure based on the base layout cell defined in operation 822. The GDS file can further include conductive patterns to indicate connectors for connecting structures, such as at least two metal-zero patterns. The GDS file can include the base layout cell pattern and associated conductive patterns arranged in a layout. Base layout cell (ECO) base marks of the base layout cells can indicate where a functional cell can be placed and routed based on a given base mark.

In operation 826, photomasks are formed based on the GDS file. In some embodiments, the GDS file provided in operation 826 is taken to a tape-out operation to generate photomasks for fabricating one or more integrated circuits. In some embodiments, a circuit layout included in the GDS file can be read and transferred onto a quartz or glass substrate to form opaque patterns that correspond to the circuit layout. The opaque patterns can be made of, for example, chromium or any other suitable metals. Operation 826 can be performed by a photomask manufacturer, where the circuit layout is read using a suitable software (e.g., EDA tool) and the circuit layout is transferred onto a substrate using a suitable printing/deposition tool. The photomasks reflect the circuit layout/features included in the GDS file.

In operation 828, one or more circuits are formed based on the photomasks generated in operation 826. In some embodiments, the photomasks are used to form patterns/structures of the circuit contained in the GDS file. In some embodiments, various fabrication tools (e.g., photolithography equipment, deposition equipment, and etching equipment) are used to form features of the one or more circuits. For example, the one or more circuits can include one or more functional cells having structures corresponding to the base layout cell coupled with structures corresponding to the conductive patterns. The structures associated with the base layout cell can include first and second metal layers based on first and second metal layer regions, first conductive gate structures associated with the conductive gate patterns, via plugs associated with the first pair of via regions, etc.

Integrated Circuit Devices Implemented with ECO Base Methodology

Figure 5C:
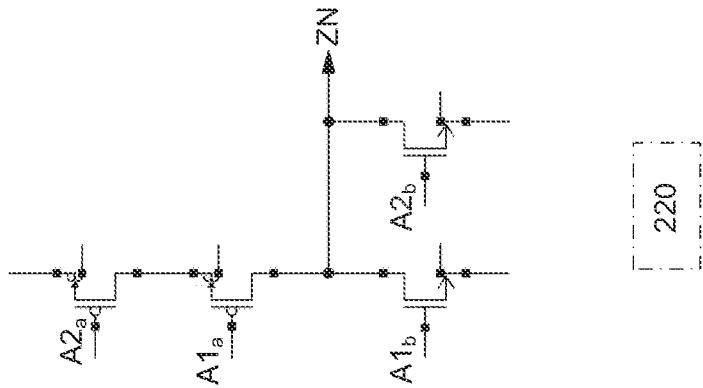
FIGS. 5A to 5D are illustrations of a selection of base layout cell(s) for functional cells, according to some embodiments.

As described above and further depicted in FIGS. 5A to 5C, a specific base layout cell for implementation of one or more functional cells can be selected based criteria, such as minimizing cell pitch. As shown in FIG. 5A, in applications that include an implementation of an inverter functional cell, such as INV 501, either of base layout cell 200 or base layout cell 220 can be used. INV 501 can include a device of a first type (e.g., p-type transistor A1) and a device of a second type (e.g., n-type transistor A2). The structure of INV 501 can be implemented in either base layout cell 200 or 220, since both can accommodate the required devices.

Figure 5B:
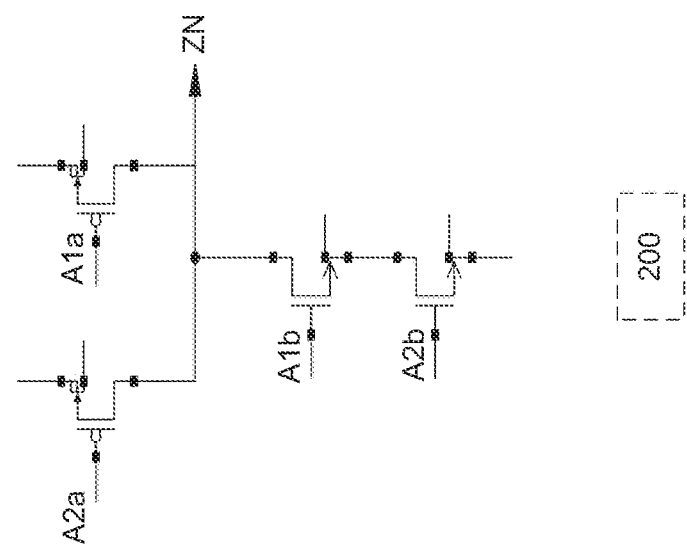
Figure 5A:
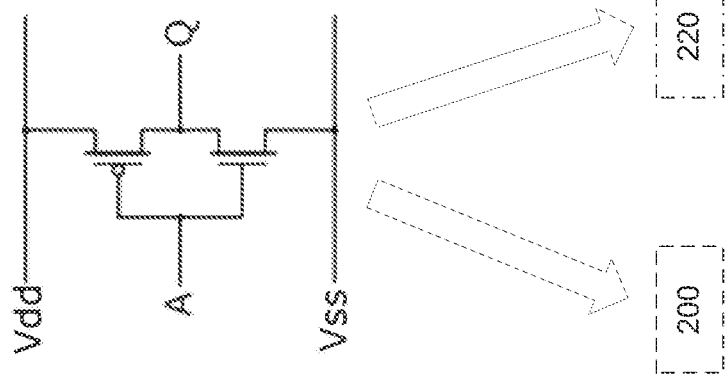

As shown in FIG. 5B, due to the required circuit connections, NAND 502 can be implemented utilizing base layout cell 200 to achieve a minimal pitch of 4 CPP. This is because NAND 502 requires an electrical connection between drain electrodes of transistors A1a and A2a, and electrical isolation between source electrodes of the same transistors. As shown in FIG. 5C, NOR 503 can be implemented utilizing base layout cell 220 to achieve a minimal pitch of 4 CPP for the inverse reason. NOR 503 requires an electrical connection between source electrodes of transistors A1b and A2b, and electrical isolation between drain electrodes of the same transistors. Thus, functional cells can be implemented based on an efficient selection of a base layout cell from a variety of base layout cells (e.g., two or more base layout cells) to effectively utilize dimensions.

Figure 5D:
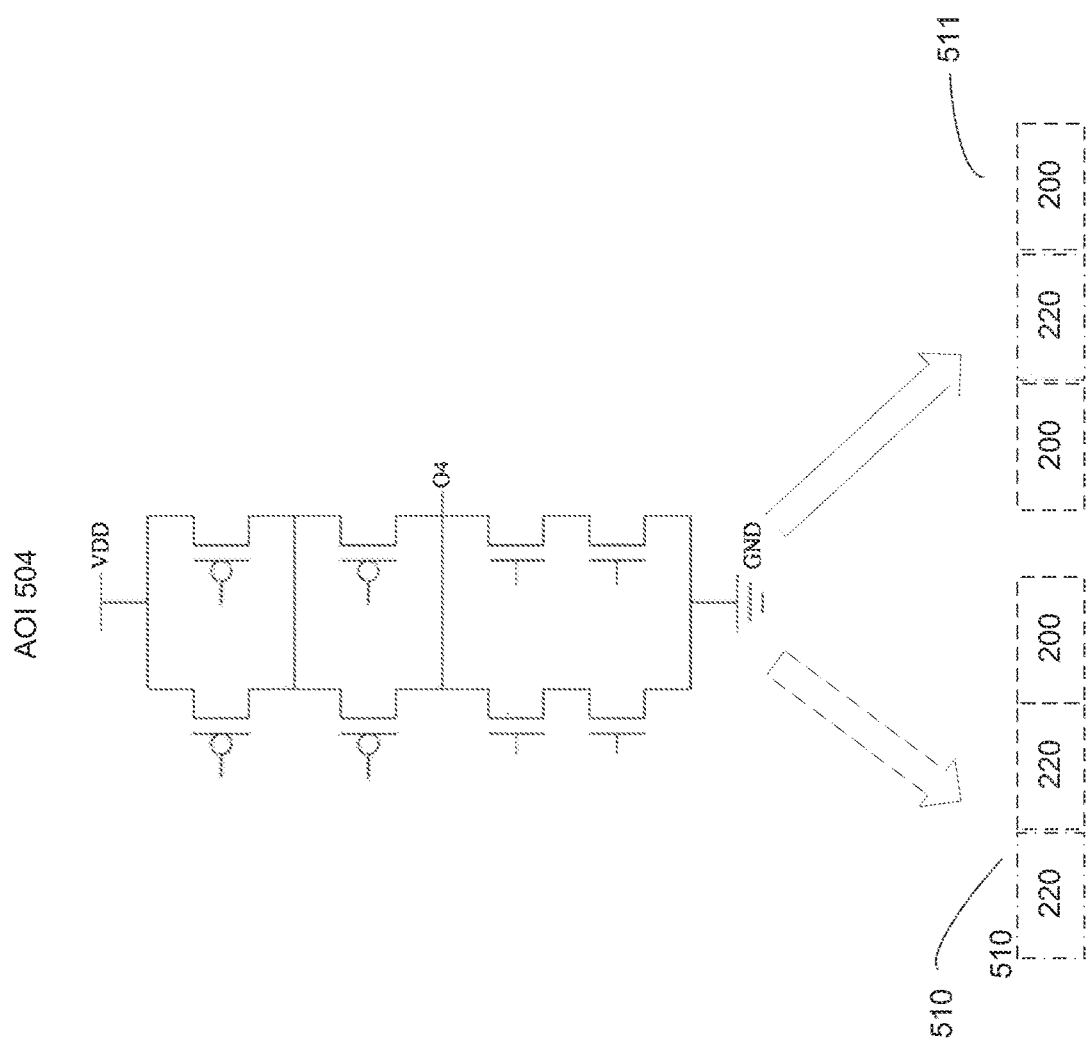

Furthermore, as described above, functional cells can be implemented utilizing two or more base layout cells (having base layout cell marks) in a combination cell, such as a second circuit described above, to further enhance efficient space utilization. As depicted in FIG. 5D, and-or-inverter (AOI22) 504 can be implemented in at least two different combination cells. According to some embodiments, AOI 504 can be implemented using either second circuit 510 or 511.

As shown in FIG. 5D, second circuit 510 includes a B-A-A sequence, having base layout cell 200 in a first base layout cell mark, abutted by base layout cell 220 within a second base layout cell mark, which is abutted again by base layout cell 200 in a third base layout cell mark. Second circuit 511 includes an A-B-A sequence, having base layout cell 220 in the first base layout cell mark, abutted by base layout cell 200 in the second base layout cell mark, abutted by base layout cell 220 in the third base layout cell mark. In either sequence, second circuit 510 or 511 can be implemented having a cell pitch of 12 CPP.

Figure 6:
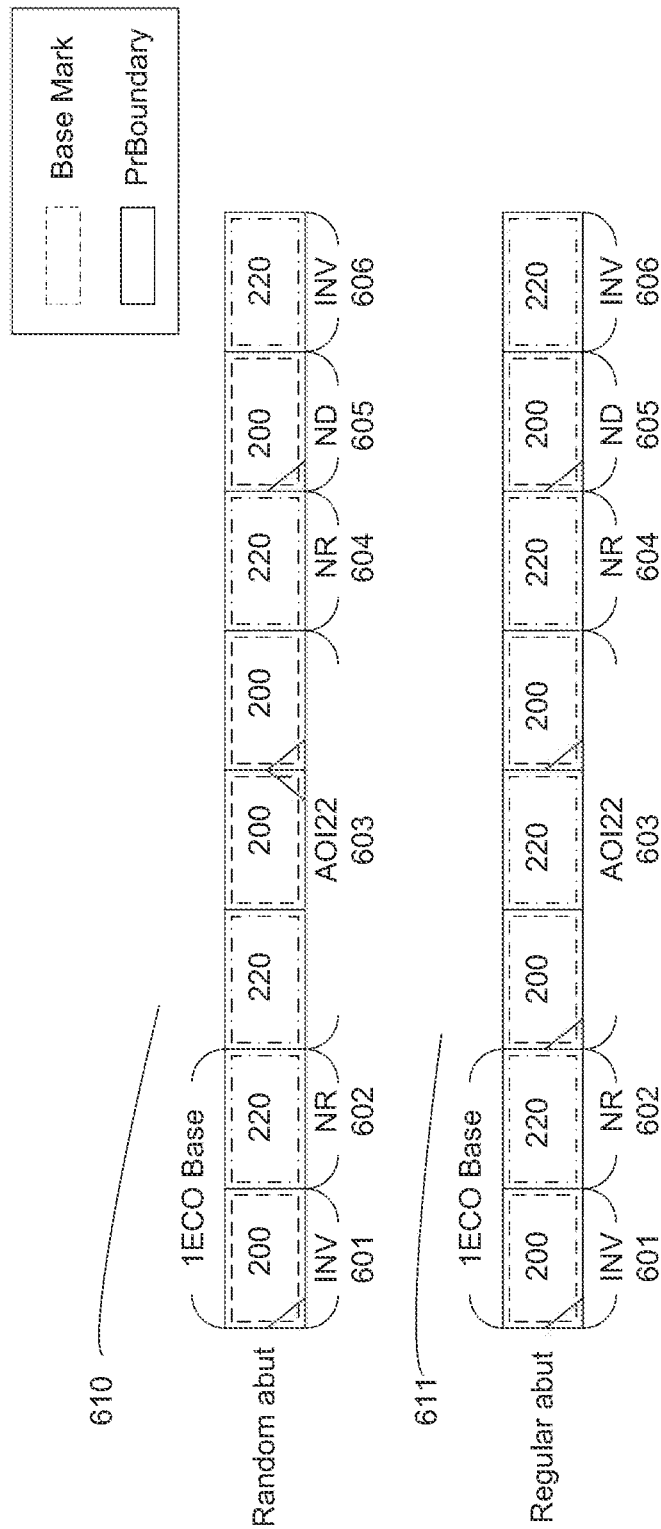
FIG. 6 is an illustration of abut patterns of base layout cells in combination cells, according to some embodiments.

In other embodiments, as shown in FIG. 6, combination circuits having different base layout cells (e.g., base layout cell 200 and base layout cell 220) can be arranged in alternative configurations. In one non-limiting example, an integrated circuit can require a first inverter functional cell (INV 601), adjacent to, in sequence with a first NR functional cell 602, an AOI functional cell 603, a second NR functional cell 604, a ND functional cell 605, and a second inverter cell 606.

Based on efficient base layout cell selection described above, with reference to FIGS. 5A to 5D, there are a number of second circuit configurations that can be utilized to implement the intended combination circuit.

For example, in second circuit 610, base layout cells 200 and 220 are arranged to abut each other in a random pattern. Implementing second circuit 610 having a random abut pattern, as depicted by an AOI represented in second circuit 511, can provide advantages to a circuit design methodology, for example in reducing an overall cell pitch of a combination circuit, such as second circuit 610.

In another non-limiting example, second circuit 611 is implemented with base layout cells 200 and 220 arranged in a regular abut sequence. That is, the bases are arranged in a sequence. In this example, base layout cells 200 and 220 are arranged in an A-B-A-B sequence. Implementing circuit design having a regular abut pattern, as depicted by second circuit 611, including an AOI represented in second circuit 510, can provide advantages in achieving other efficiencies, for example, simplifying manufacturing operations, reducing mask requirements and other resources.

Figure 7:
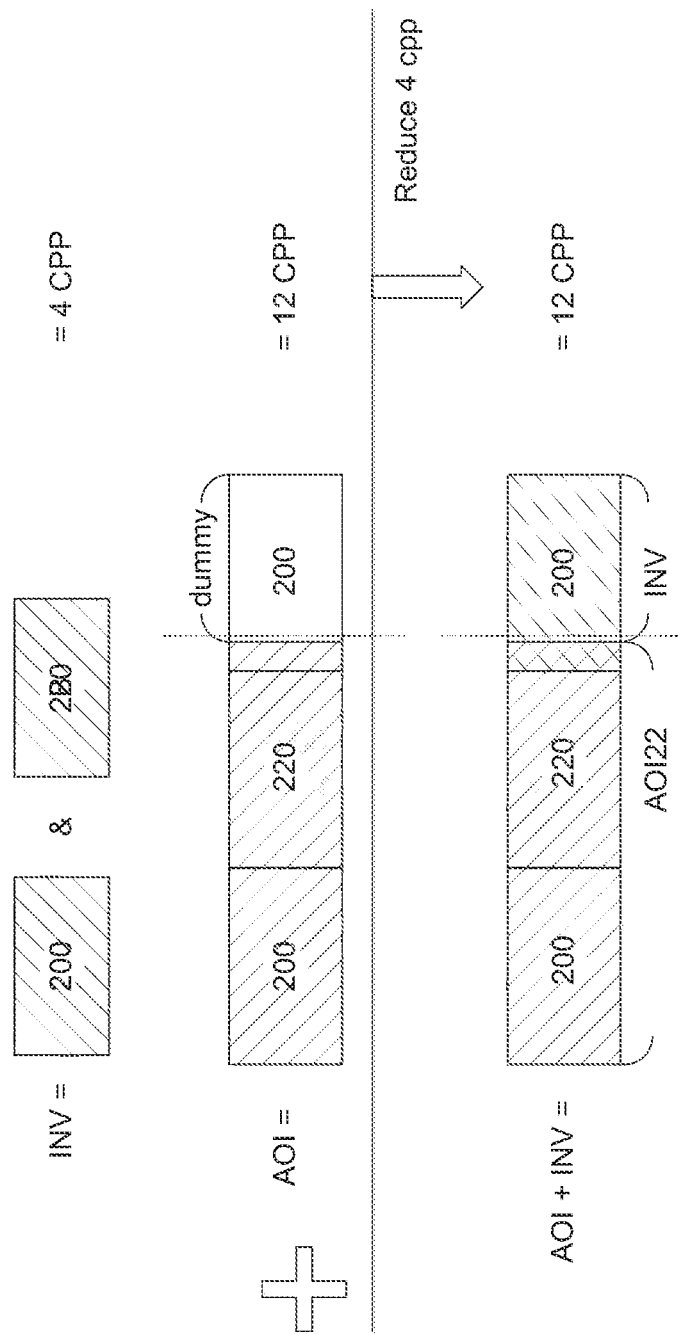
FIG. 7 is an illustration of functional cells in combination cells implementing base layout cells, according to some embodiments.

According to additional embodiments, circuits can be combined, or merged, in a combination cell, such as a second circuit described above, having more than one base layout cell to an overall cell pitch. For example, as described above and as depicted in FIG. 7, an inverter functional cell, such as INV 501 can be implemented with a base layout cell 200 or 220, either having a cell pitch of 4 CPP. An and-or-inverter cell, such as AOI 504 can be provided in a second circuit 510 or 511 having differing sequences of base layout cells 200 and 220. Implementing AOI 504 in either sequence can result in second circuit having a cell pitch of 12 CPP. However, in applications implementing a second circuit 700, which combines or merges INV 501 and AOI 504, the resulting device can be implemented with second circuit 511, efficiently utilizing the devices formed based on active areas of each base layout cell, and having a reduced cell pitch of 12 CPP for the combination cell.

Figure 9:
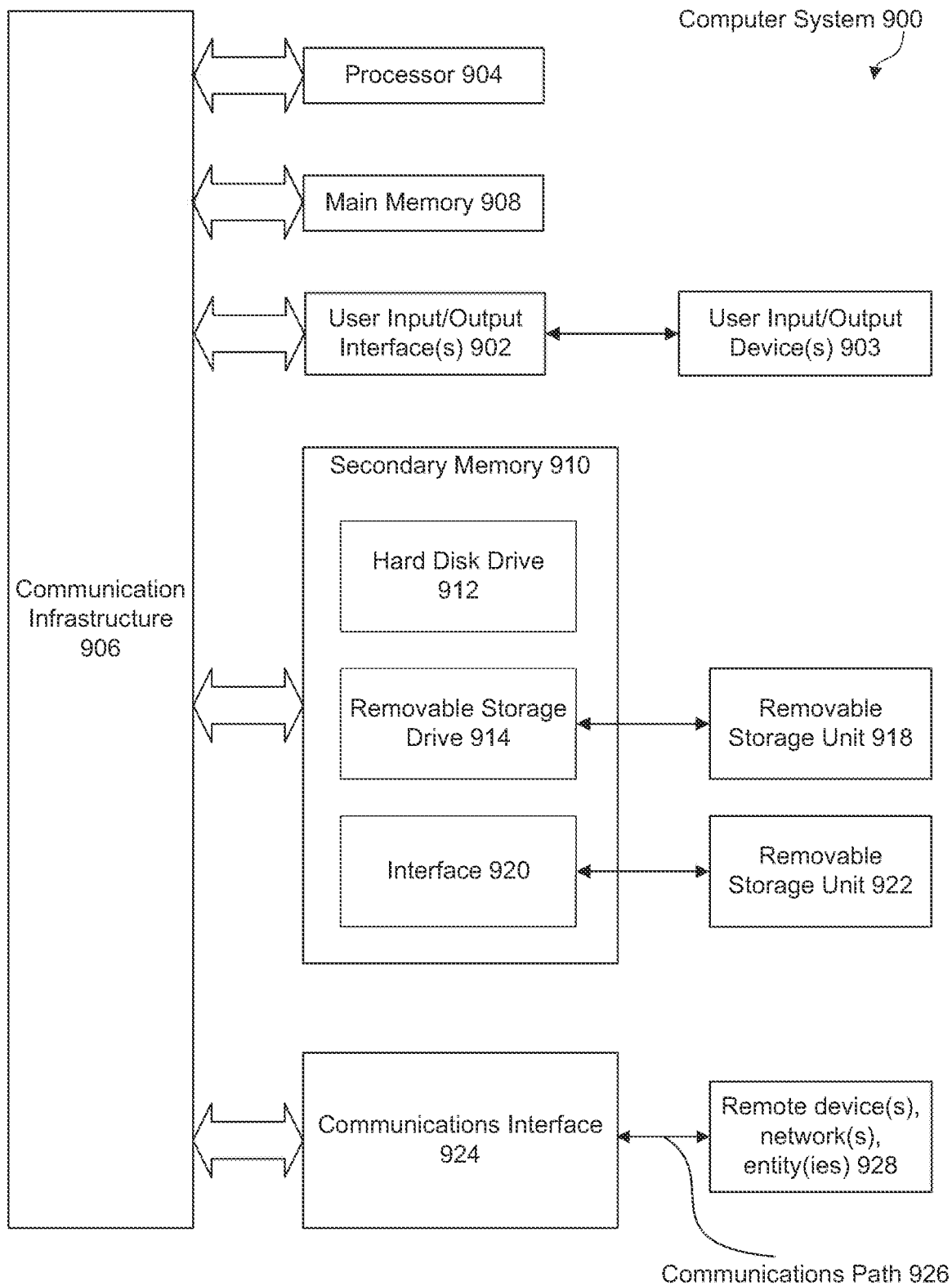
FIG. 9 is an illustration of an example computer system in which various embodiments of the present disclosure can be implemented, according to some embodiments of the present disclosure.

FIG. 9 is an illustration of an example computer system 900 in which various embodiments of the present disclosure can be implemented, according to some embodiments. Computer system 900 can be any well-known computer capable of performing the functions and operations described herein. For example, and without limitation, computer system 900 can be capable of pre-placing layout cells and connecting layout units in the layout cells to provide circuit implementations in an IC layout design using, for example, an EDA tool. Computer system 900 can be used, for example, to execute one or more operations in methods 800 and 820, which describes an example method for connecting layout units in a pre-placement layout cell.

Computer system 900 includes one or more processors (also called central processing units, or CPUs), such as a processor 904. Processor 904 is connected to a communication infrastructure or bus 906. Computer system 900 also includes input/output device(s) 903, such as monitors, keyboards, pointing devices, etc., that communicate with communication infrastructure or bus 906 through input/output interface(s) 902. An EDA tool can receive instructions to implement functions and operations described herein—e.g., methods 800 and 820 of FIGS. 8A and 8B—via input/output device(s) 903. Computer system 900 also includes a main or primary memory 908, such as random access memory (RAM). Main memory 908 can include one or more levels of cache. Main memory 908 has stored therein control logic (e.g., computer software) and/or data. In some embodiments, the control logic (e.g., computer software) and/or data can include one or more of the operations described above with respect to methods 800 and 820 of FIGS. 8A and 8B.

Computer system 900 can also include one or more secondary storage devices or memory 910. Secondary memory 910 can include, for example, a hard disk drive 912 and/or a removable storage device or drive 914. Removable storage drive 914 can be a floppy disk drive, a magnetic tape drive, a compact disk drive, an optical storage device, tape backup device, and/or any other storage device/drive.

Removable storage drive 914 can interact with a removable storage unit 918. Removable storage unit 918 includes a computer usable or readable storage device having stored thereon computer software (control logic) and/or data. Removable storage unit 918 can be a floppy disk, magnetic tape, compact disk, DVD, optical storage disk, and/or other computer data storage device. Removable storage drive 914 reads from and/or writes to removable storage unit 918 in a well-known manner.

According to some embodiments, secondary memory 910 can include other means, instrumentalities, or other approaches for allowing computer programs and/or other instructions and/or data to be accessed by computer system 900. Such means, instrumentalities or other approaches can include, for example, a removable storage unit 922 and an interface 920. Examples of the removable storage unit 922 and the interface 920 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 910, removable storage unit 918, and/or removable storage unit 922 can include one or more of the operations described above with respect to methods 800 and 820 of FIGS. 8A and 8B.

Computer system 900 can further include a communication or network interface 924. Communication interface 924 enables computer system 900 to communicate and interact with any combination of remote devices, remote networks, remote entities, etc. (individually and collectively referenced by reference number 928). For example, communication interface 924 can allow computer system 900 to communicate with remote devices 928 over communications path 926, which can be wired and/or wireless, and which can include any combination of LANs, WANs, the Internet, etc. Control logic and/or data can be transmitted to and from computer system 900 via communication path 926.

The operations in the preceding embodiments can be implemented in a wide variety of configurations and architectures. Therefore, some or all of the operations in the preceding embodiments—e.g., methods 800 and 820 of FIGS. 8A and 8B—can be performed in hardware, in software or both. In some embodiments, a tangible apparatus or article of manufacture including a tangible computer useable or readable medium having control logic (software) stored thereon is also referred to herein as a computer program product or program storage device. This includes, but is not limited to, computer system 900, main memory 908, secondary memory 910, and removable storage units 918 and 922, as well as tangible articles of manufacture embodying any combination of the foregoing. Such control logic, when executed by one or more data processing devices (such as computer system 900), causes such data processing devices to operate as described herein.

Figure 10:
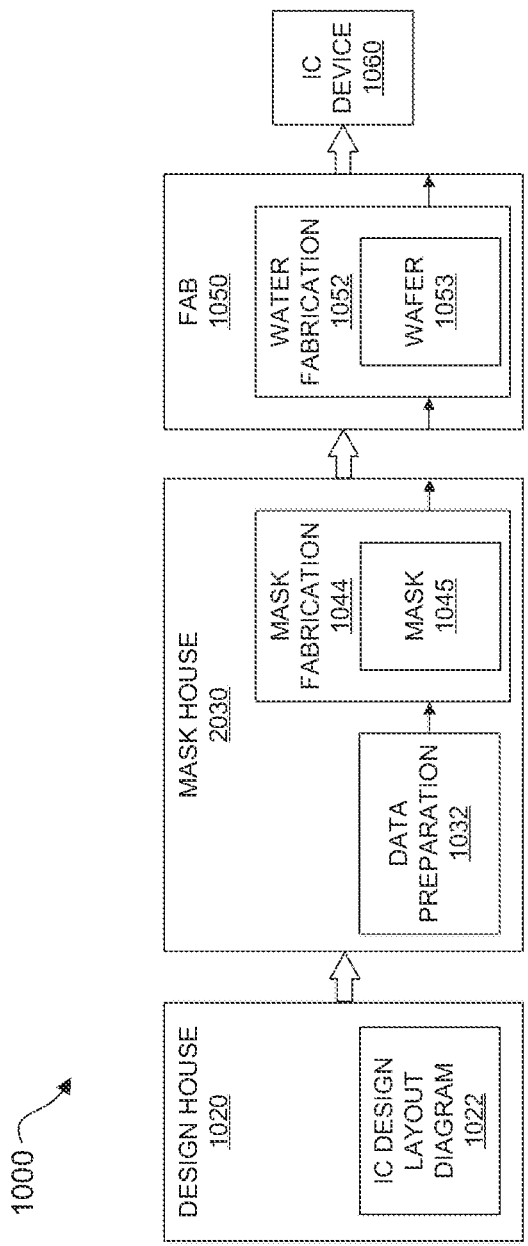
FIG. 10 is an illustration of an integrated circuit manufacturing system and associated integrated circuit manufacturing flow, according to some embodiments of the present disclosure.

FIG. 10 is an illustration of an IC manufacturing system 1000 and associated IC manufacturing flow, according to some embodiments. In some embodiments, the layout cells described herein—e.g., base cell arrangements 110 and 130 of FIGS. 1A and 1B, respectively, base layout cell 150 of FIG. 1C, base layout cell 200 and 220 of FIGS. 2, 5A to 5D, 6 and 7, and base layout cells 300 and 320 of FIGS. 3, 4A and 4B—can be fabricated using IC manufacturing system 1000.

IC manufacturing system 1000 includes a design house 1020, a mask house 1030, and an IC manufacturer/fabricator ("fab") 1050—each of which interacts with one another in the design, development, and manufacturing cycles and/or services related to manufacturing an IC device 1060. Design house 1020, mask house 1030, and fab 1050 are connected by a communications network. In some embodiments, the communications network is a single network. In some embodiments, the communications network is a variety of different networks, such as an intranet and the Internet. The communications network includes wired and/or wireless communication channels. Each of design house 1020, mask house 1030, and fab 1050 interacts with one another and provides services to and/or receives services from one another. In some embodiments, two or more of design house 1020, mask house 1030, and fab 1050 coexist in a common facility and use common resources.

Design house 1020 generates an IC design layout diagram 1022. IC design layout diagram 1022 includes various geometrical patterns, such as the patterns shown in base cell arrangements 110 and 130 of FIGS. 1A and 1B, respectively, base layout cell 150 of FIG. 1C, base layout cell 200 and 220 of FIGS. 2, 5A to 5D, 6 and 7, and base layout cells 300 and 320 of FIGS. 3, 4A and 4B. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, a gate electrode, a source and drain, and conductive segments or vias of an interlayer interconnection, to be formed in a semiconductor substrate (e.g., a silicon wafer) and various material layers disposed on the semiconductor substrate. Design house 1020 implements a proper design procedure to form IC design layout diagram 1022. The design procedure includes one or more of logic design, physical design, and place and route design. IC design layout diagram 1022 can be presented in one or more data files with information on the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture a mask 1045 (or reticle 1045) to be used for fabricating the various layers of IC device 1060. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer that converts the RDF to an image on a substrate, such as mask 1045 or a semiconductor wafer 1053. IC design layout diagram 1022 can be manipulated by mask data preparation 1032 to comply with particular characteristics of the mask writer and/or requirements of fab 1050. In FIG. 10, data preparation 1032 and mask fabrication 1044 are illustrated as separate elements. In some embodiments, data preparation 1032 and mask fabrication 1044 can be collectively referred to as "mask data preparation."

In some embodiments, data preparation 1032 includes optical proximity correction (OPC), which uses lithography enhancement techniques to compensate for image errors, such as those that can arise from diffraction, interference, and other process effects. OPC adjusts IC design layout diagram 1022. In some embodiments, data preparation 1032 includes further resolution enhancement techniques (RET), such as off-axis illumination, sub-resolution assist features, phase-shifting masks, other suitable techniques, and combinations thereof. In some embodiments, inverse lithography technology (ILT) can be used, which treats OPC as an inverse imaging problem.

In some embodiments, data preparation 1032 includes a mask rule checker (MRC) that checks whether IC design layout diagram 1022 has undergone OPC with a set of mask creation rules that include geometric and/or connectivity restrictions to ensure sufficient margins, to account for variability in semiconductor manufacturing processes. In some embodiments, the MRC modifies TC design layout diagram 1022 to compensate for limitations during mask fabrication 1044, which may undo part of the modifications performed by OPC to meet mask creation rules.

In some embodiments, data preparation 1032 includes lithography process checking (LPC) that simulates processing that will be implemented by fab 1050 to fabricate IC device 1060. LPC simulates this processing based on IC design layout diagram 1022 to create a simulated manufactured device, such as IC device 1060. The processing parameters in the LPC simulation can include parameters associated with various processes of the IC manufacturing cycle, parameters associated with tools used for IC manufacturing, and/or other aspects of the manufacturing process. LPC takes into account various factors, such as aerial image contrast, depth of focus (DOF), mask error enhancement factor (MEEF), and other suitable factors. In some embodiments, after a simulated manufactured device has been created by LPC and if the simulated device does not satisfy design rules, OPC and/or MRC are be repeated to further refine IC design layout diagram 1022.

In some embodiments, data preparation 1032 includes additional features, such as a logic operation (LOP) to modify IC design layout diagram 1022 based on manufacturing rules. Additionally, the processes applied to IC design layout diagram 1022 during data preparation 1032 may be executed in a different order than described above.

After data preparation 1032 and during mask fabrication 1044, mask 1045 is fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams are used to form a pattern on mask 1045 based on the modified IC design layout diagram 1022.

Mask 1045 can be formed by various technologies. In some embodiments, mask 1045 is formed using binary technology. In some embodiments, a mask pattern includes opaque regions and transparent regions. A radiation beam, such as an ultraviolet (UV) beam, can be used to expose the image sensitive material layer (e.g., photoresist) coated on a wafer. The radiation beam is blocked by the opaque region and transmits through the transparent regions. For example, a binary mask version of mask 1045 includes a transparent substrate (e.g., fused quartz) and an opaque material (e.g., chromium) coated in the opaque regions of the binary mask.

In some embodiments, mask 1045 is formed using a phase shift technology. In a phase shift mask (PSM) version of mask 1045, various features in the pattern formed on the phase shift mask are configured to have proper phase difference to enhance the resolution and imaging quality. For example, the phase shift mask can be attenuated PSM or alternating PSM.

The mask generated by mask fabrication 1044 is used in a variety of processes. For example, the mask can be used in an ion implantation process to form various doped regions in semiconductor wafer 1053, in an etching process to form various etching regions in semiconductor wafer 1053, and/or in other suitable processes.

Fab 1050 includes wafer fabrication 1052. Fab 1050 can include one or more manufacturing facilities for the fabrication of a variety of different IC products. In some embodiments, fab 1050 is a semiconductor foundry. For example, there may be a manufacturing facility for front-end fabrication of IC products (front-end-of-line (FEOL) fabrication), a second manufacturing facility to provide back end fabrication for the interconnection and packaging of the IC products (back-end-of-line (BEOL) fabrication), and a third manufacturing facility to provide other services for the foundry business.

Fab 1050 uses mask 1045 fabricated by mask house 1030 to fabricate IC device 1060. In some embodiments, semiconductor wafer 1053 is fabricated by fab 1050 using mask 1045 to form IC device 1060. In some embodiments, the IC fabrication includes performing one or more lithographic exposures based on IC design layout diagram 1022. Semiconductor wafer 1053 includes a silicon substrate or any other appropriate substrate with material layers formed thereon. Semiconductor wafer 1053 further includes doped regions, dielectric features, multilevel interconnects, and other suitable features.

Embodiments described herein relate to an ECO base, e.g., a base layout cell. According to some embodiments, a base layout cell can be placed in a layout. The base layout cell can include first and second metal layer patterns extending in a first direction; active area layer patterns between the first metal layer pattern and the second metal layer pattern, where the active area layer patterns extend in the first direction; conductive gate layer patterns extending in a second direction perpendicular to the first direction and traversing over the first and second metal layer patterns and over the active area layer patterns; contact layer patterns extending in the second direction between two conductive gate layer patterns of the conductive gate layer patterns, where at least one contact layer pattern of the contact layer patterns traverses over at least one active area layer pattern of the active area layer patterns; and a cut metal layer extending in the first direction between two active area layer patterns of the active area layer patterns, where the cut metal layer is between at least two conductive gate layer patterns. In some embodiments, elements of the layout can be connected to represent a first circuit, including one or more of the first and second metal layer patterns, the active area layer patterns, the conductive gate layer patterns, and the contact layer patterns. In some embodiments, the first circuit can be connected to a second circuit, where at least one of the placing the base layout cell in the layout, the connecting the one or more of the first and second metal layer patterns, the active area layer patterns, the conductive gate layer patterns, the contact layer patterns to represent a first circuit, and the connecting the first circuit to the second circuit is performed by one or more processors.

In some embodiments, a non-transitory computer-readable medium having instructions stored therein, which when executed by a processor of a device, for example a hand held device, causes the processor to perform operations. Such operations can include placing, by the processor, a base layout cell in a layout. The base layout cell can include first and second metal layer patterns extending in a first direction; active area layer patterns between the first metal layer pattern and the second metal layer pattern, where the active area layer patterns extend in the first direction; conductive gate layer patterns extending in a second direction perpendicular to the first direction and traversing over the first and second metal layer patterns and over the active area layer patterns; contact layer patterns extending in the second direction between two conductive gate layer patterns of the conductive gate layer patterns, where at least one contact layer pattern of the contact layer patterns traverses over at least one active area layer pattern of the active area layer patterns; and a cut metal layer extending in the first direction between two active area layer patterns of the active area layer patterns, where the cut metal layer is between at least two conductive gate layer patterns. The operations can further include connecting, by the processor, one or more of the first and second metal layer patterns, the active area layer patterns, the conductive gate layer patterns, the contact layer patterns to represent a first circuit; and connecting, by the processor, the first circuit to a second circuit.

According to some embodiments, the first functional cell and the second functional cell of the at least two non-identical functional cells are selected from an inverter, an NAND, a NOR, or an AND-OR-INVERTER functional cell. In some embodiments, a functional cell implements a base layout cell that is selected based on a cell pitch value. In some embodiments, the base layout cell is selected from two or more non-identical base layout cells to be implemented in the first functional cell and the second functional cell based on a determination of a cell pitch of the first functional cell and the second functional cell. In other embodiments, the base layout cell is selected based on a determination of a cell pitch of a combination cell that includes the first functional cell and the second functional cell.

In some embodiments, placing the base layout cell includes placing the base layout cell with one or more layout patterns common to non-identical functional cell layouts. In some embodiments the first circuit can be defined, at least partially, based upon a base mark of the base layout cell. In some embodiments, connecting the first circuit to the second circuit can include arranging the first circuit and the second circuit based on a combined cell pitch of the first circuit and the second circuit. In some embodiments, arranging the first circuit and the second circuit includes arranging the first circuit and the second circuit can be performed with an electronic design automation tool. In some embodiments, connecting one or more of the first and second metal layer patterns can include routing one or more of the first and second metal layer patterns to a power supply, ground, or a combination thereof.

According to some embodiments, a place and route methodology defines a functional cell based on a base layout cell mark. Combination cells can include functional cells patterned based on one or more base layout cells. For example, combination cells can include functional cells based on two or more base layout cells, selected for minimizing or reducing a cell pitch of the combination cell. In another example, a combination cell can include functional cells defined by base layout cells arranged in a sequence. According to some embodiments, the sequence may follow a regular abut pattern of two or more base layout cell implementations. In some embodiments, the sequence may follow a random abut pattern of two or more base layout cell implementations.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present disclosure should not be limited by any of the above-described exemplary embodiments, but should be defined only in accordance with the following claims and their equivalents.

What is claimed is:

1. A method, comprising:
    placing a base layout cell in a layout, wherein the base layout cell comprises:
        first and second metal layer patterns extending in a first direction;
        a plurality of active area layer patterns between the first metal layer pattern and the second metal layer pattern, wherein the plurality of active area layer patterns extends in the first direction;
        a plurality of conductive gate layer patterns extending in a second direction perpendicular to the first direction and traversing over the first and second metal layer patterns and over the plurality of active area layer patterns;
        a plurality of contact layer patterns extending in the second direction between two conductive gate layer patterns of the plurality of conductive gate layer patterns, wherein at least one contact layer pattern of the plurality of contact layer patterns traverses over at least one active area layer pattern of the plurality of active area layer patterns; and
        a cut metal layer extending in the first direction between two active area layer patterns of the plurality of active area layer patterns, wherein the cut metal layer is between at least two conductive gate layer patterns;
    connecting one or more of the first and second metal layer patterns, the plurality of active area layer patterns, the plurality of conductive gate layer patterns, the plurality of contact layer patterns to represent a first circuit; and
    defining the first circuit based on a base mark of the base layout cell.

2. The method of claim 1, wherein the placing the base layout cell comprises selecting the base layout cell from a plurality of base layout cells applicable to an inverter functional cell, an NAND functional cell, a NOR functional cell, or an AND-OR-INVERTER functional cell.

3. The method of claim 2, wherein the placing the base layout cell comprises selecting the base layout cell based on a layout cell pitch value.

4. The method of claim 1, wherein the first circuit comprises one or more layout patterns common to a plurality of non-identical functional cell layouts.

5. The method of claim 1, wherein the connecting one or more of the first and second metal layer patterns comprises routing one or more of the first and second metal layer patterns to a power supply, ground, or a combination thereof.

6. The method of claim 1, further comprising connecting the first circuit to a second circuit, wherein at least one of the placing the base layout cell in the layout, the connecting the one or more of the first and second metal layer patterns, the plurality of active area layer patterns, the plurality of conductive gate layer patterns, the plurality of contact layer patterns to represent the first circuit, and the connecting the first circuit to the second circuit is performed by one or more processors.

7. The method of claim 6, wherein the connecting the first circuit to the second circuit comprises arranging the first circuit and the second circuit based on a combined cell pitch of the first circuit and the second circuit.

8. The method of claim 7, wherein the arranging the first circuit and the second circuit comprises arranging the first circuit and the second circuit with an electronic design automation tool.

9. A base layout cell, comprising:
    first and second metal layer patterns extending in a first direction;
    a plurality of active area layer patterns between the first metal layer pattern and the second metal layer pattern, wherein the plurality of active area layer patterns extends in the first direction;
    a plurality of conductive gate layer patterns extending in a second direction perpendicular to the first direction and traversing over the first and second metal layer patterns and over the plurality of active area layer patterns;
    a plurality of metal-layer patterns extending in the second direction between two conductive gate layer patterns of the plurality of conductive gate layer patterns, wherein at least one metal-layer pattern of the plurality of metal-layer patterns traverses over at least one active area layer pattern of the plurality of active area layer patterns; and a cut metal layer extending in the first direction between two active area layer patterns of the plurality of active area layer patterns,
wherein the cut metal layer is between at least two conductive gate layer patterns and separated from the plurality of metal-layer patterns, and
wherein the base layout cell comprises one or more layout patterns common to a plurality of non-identical functional cell layouts.

10. The base layout cell of claim 9, wherein the base layout cell comprises at least one layout pattern representative of an inverter functional cell, an NAND functional cell, a NOR functional cell, or an AND-OR-INVERTER functional cell.

11. The base layout cell of claim 10, wherein the base layout cell omits interconnections that are not commonly shared between at least two functional cell layout patterns.

12. The base layout cell of claim 9, wherein the base layout cell has a layout cell pitch value corresponding to at least one layout pattern having an arrangement common to a plurality of functional cell layouts, and wherein the base layout cell is selected from a plurality of base layout cells based on the cell pitch value.

13. The base layout cell of claim 9, wherein the first metal layer pattern and the second metal layer pattern are isolated from each other, and wherein the base layout cell is arranged to be implemented in a first circuit by connecting one or more of the first and second metal layer patterns, the plurality of active area layer patterns, the plurality of conductive gate layer patterns, and the plurality of metal-layer patterns to represent the first circuit.

14. The base layout cell of claim 13, further comprising a base mark associated with a boundary of the first circuit, wherein the base mark indicates a boundary of at least one layout pattern with an arrangement common to a plurality of functional cell layouts.

15. A non-transitory computer-readable medium having instructions stored therein, which when executed by a processor of a hand held device, causes the processor to perform operations, the operations comprising:
   placing, by the processor, a base layout cell in a layout, wherein the base layout cell comprises:
      first and second metal layer patterns extending in a first direction;
      a plurality of active area layer patterns between the first metal layer pattern and the second metal layer pattern, wherein the plurality of active area layer patterns extends in the first direction;
      a plurality of conductive gate layer patterns extending in a second direction perpendicular to the first direction and traversing over the first and second metal layer patterns and over the plurality of active area layer patterns;
      a plurality of metal-zero patterns extending in the second direction between two conductive gate layer patterns of the plurality of conductive gate layer patterns, wherein a first metal-zero pattern of the plurality of metal-zero patterns traverses over at least one active area layer pattern of the plurality of active area layer patterns, and wherein a width of a second metal-zero pattern of the plurality of metal-zero patterns is less than a width of the at least one active area layer pattern; and
      a cut metal layer extending in the first direction between two active area layer patterns of the plurality of active area layer patterns, wherein the cut metal layer is between at least two conductive gate layer patterns;
   connecting, by the processor, one or more of the first and second metal layer patterns, the plurality of active area layer patterns, the plurality of conductive gate layer patterns, the plurality of metal-zero patterns to represent a first circuit; and
   connecting, by the processor, the first circuit to a second circuit.

16. The non-transitory computer-readable medium of claim 15, wherein the placing the base layout cell comprises selecting the base layout cell based on a layout cell pitch value.

17. The non-transitory computer-readable medium of claim 15, wherein the base layout cell comprises one or more layout patterns common to a plurality of non-identical functional cell layouts.

18. The non-transitory computer-readable medium of claim 15, wherein the connecting the first circuit to the second circuit comprises arranging the first circuit and the second circuit based on a combined cell pitch of the first circuit and the second circuit.

19. The non-transitory computer-readable medium of claim 15, wherein the operations further comprise defining, by the processor, the first circuit based on a base mark of the base layout cell.

20. The non-transitory computer-readable medium of claim 15, wherein the operations further comprise routing, by the processor, one or more of the first and second metal layer patterns to a power supply, ground, or a combination thereof.

* * * * *